United States Patent
Sugitatsu et al.

(10) Patent No.: US 7,436,873 B2
(45) Date of Patent: Oct. 14, 2008

(54) OPTICAL DEVICE AND SEMICONDUCTOR LASER OSCILLATOR

(75) Inventors: Atsushi Sugitatsu, Tokyo (JP); Susumu Noda, Kyoto (JP)

(73) Assignees: Mitsubishi Denki Kabushiki Kaisha, Tokyo (JP); Kyoto University, Kyoto, Kyoto (JP)

( * ) Notice: Subject to any disclaimer, the term of this patent is extended or adjusted under 35 U.S.C. 154(b) by 369 days.

(21) Appl. No.: 10/897,004

(22) Filed: Jul. 23, 2004

(65) Prior Publication Data

US 2005/0018734 A1    Jan. 27, 2005

(30) Foreign Application Priority Data

Jul. 25, 2003  (JP)  ............................. 2003-279858
Jul. 1, 2004  (JP)  ............................. 2004-195578

(51) Int. Cl.
*H01S 3/08* (2006.01)
*H01L 33/00* (2006.01)

(52) U.S. Cl. ............................. 372/98; 372/92; 257/79; 257/98; 257/E33.003

(58) Field of Classification Search ................... 372/92, 372/98; 257/79, 98, E33.003
See application file for complete search history.

(56) References Cited

U.S. PATENT DOCUMENTS

| | | | |
|---|---|---|---|
| 6,597,721 B1 * | 7/2003 | Hutchinson et al. ........... | 372/98 |
| 6,618,535 B1 * | 9/2003 | Reynolds .................... | 385/129 |
| 6,674,778 B1 * | 1/2004 | Lin et al. .................. | 372/46.01 |
| 6,996,319 B2 * | 2/2006 | Noda et al. ................. | 385/129 |
| 7,092,419 B2 * | 8/2006 | Woodley et al. ......... | 372/38.05 |
| 2002/0118941 A1 * | 8/2002 | Notomi et al. .............. | 385/129 |
| 2002/0146196 A1 * | 10/2002 | Shirane et al. ................ | 385/16 |
| 2003/0141507 A1 * | 7/2003 | Krames et al. ................ | 257/79 |
| 2003/0202764 A1 * | 10/2003 | Lee et al. .................... | 385/129 |

FOREIGN PATENT DOCUMENTS

JP    2003-279765    *    2/2003

OTHER PUBLICATIONS

Machine English Translation (obtained fro the JPO) of 2003-279765.*
Sugitatsu et al.; "Proposal of Line-defect-waveguide Laser with Transverse Current Injection Structure in 2D Photonic Crystal Slab", *Tech. Digest Intl. Symposium on Photonic and Electromagnetic Crystal Structures V PECS-V, (Mar. 7-11, 2004), Japan.*

* cited by examiner

*Primary Examiner*—Jerome Jackson, Jr.
*Assistant Examiner*—Hrayr A. Sayadian
(74) *Attorney, Agent, or Firm*—Leydig, Voit & Mayer, Ltd.

(57) ABSTRACT

In an optical device, a slab layer includes an active layer sandwiched between cladding layers. The slab layer has a periodic refractive index profile structure in a two-dimensional plane, as a two-dimensional slab photonic crystal structure, and a linear defect region serving as a waveguide in the periodic refractive index profile structure. Regions having different widths of the waveguides, as segments of the waveguide, are connected in series.

9 Claims, 21 Drawing Sheets

OPTICAL DEVICE AND SEMICONDUCTOR LASER OSCILLATOR

BACKGROUND OF THE INVENTION

1) Field of the Invention

The present invention relates to an optical device which is used for optical communication and optical information processing, and which outputs, controls, detects, or introduces a multi-wavelength laser light or a tunable laser light using two-dimensional slab photonic crystal, to an optical device manufacturing method, and to a semiconductor laser oscillator.

2) Description of the Related Art

A laser module used in conventional multi-wavelength lasers, tunable lasers or wavelength-selectable lasers includes laser diodes that output laser lights of different wavelengths, a multi-mode interference (MMI) optical coupler that multiplexes the laser lights output from the laser diodes, and a semiconductor optical amplifier (SOA) that amplifies the laser light multiplexed. The laser diodes are arranged in parallel and constituent elements of the laser diodes are connected to one another by a waveguide. In the conventional laser module, the laser lights output from all of the laser diodes or some of the laser diodes are multiplexed by the MMI optical coupler, amplified to a predetermined signal level by the SOA, and then output (see, for example, "Wavelength-Selectable LD module with Multi-Wavelength Monitor of 50 GHz Spacing", Tadanori IWAFUJI et al, Proceedings of the Electronics Society Conference, the Institute of Electronics, Information, and Communication Engineers, 2001, p. 165).

However, because the respective laser diodes are arranged in parallel, it is necessary to form electrodes necessary to drive or control the laser diodes in an overlapped fashion. As a result, the structure of the laser module becomes complicated and the manufacturing process becomes cumbersome.

In the technology disclosed in the above-mentioned literature, the laser lights from the laser diodes are output from a single emission port and multiplexed with an MMI optical coupler. However, in that case, the more the number of wavelengths is, the greater the connection loss of the MMI optical coupler becomes. As a result, addition of a SOA becomes necessary so that the efficiency of the laser module lowers. Also, an active layer is provided in each laser diode so that, if the laser module is employed as the tunable laser, the laser diodes can merely pump their active layers independently. In addition, since the SOA is integrally provided with the laser diodes, a device size of the laser module is disadvantageously made large. Further, the conventional optical devices that use the slab photonic crystal are inferior in radiation characteristics. It is difficult for an active device such as a laser, in particular, to realize high power output because of its limit to self radiation.

SUMMARY OF THE INVENTION

It is an object of the present invention to solve at least the problems in the conventional technology.

An optical device according to an aspect of the present invention is an optical device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure. A plurality of regions having different widths of the waveguides are formed so that segments of the waveguide are connected in series.

A semiconductor laser oscillator according to another aspect of the present invention includes an optical, device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure, wherein a plurality of regions having different widths of the waveguide are formed so that segments of the waveguide are connected in series. The semiconductor laser oscillator simultaneously actuates all of the regions of the optical device and fetches laser lights from the all regions from the end portion of the segments of the wave guide connected in series.

A semiconductor laser oscillator according to still another aspect of the present invention includes an optical device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure, wherein a plurality of regions having different widths of the waveguide are formed so that segments of the waveguide are connected in series. The semiconductor laser oscillator actuates one of the regions of the optical device and fetches a laser light from the region actuated from the end portion of the segments of the waveguide connected in series.

An optical device according to still another aspect of the present invention is an optical device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure. A plurality of regions having different lattice constants of unit lattices that constitute the periodic refractive index profile structure so that segments of the waveguide are connected in series.

A semiconductor laser oscillator according to still another aspect of the present invention includes an optical device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure, wherein a plurality of regions having different lattice constants of unit lattices that constitute the periodic refractive index profile structure so that segments of the waveguide are connected in series. The semiconductor laser oscillator simultaneously actuates all of the regions of the optical device and fetches laser lights from the all regions from the end portion of the segments of the waveguide connected in series.

A semiconductor laser oscillator according to still another aspect of the present invention includes an optical device in which a slab layer formed by stacking an active layer and cladding layers and spreading two-dimensionally has a periodic refractive index profile structure in a two-dimensional plane, and which is constituted by a two-dimensional slab photonic crystal structure in which a linear defect region serving as a waveguide is introduced into the periodic refractive index profile structure, a plurality of regions having different lattice constants of unit lattices that constitute the periodic refractive index profile structure so that segments of the waveguide are connected in series. The semiconductor laser oscillator actuates one of the regions of the optical device and fetches a laser light from the region actuated from the end portion of the segments of the waveguide connected in series.

An optical device according to still another aspect of the present invention includes a slab layer formed by stacking an active layer and cladding layers and spreading two-dimensionally has a periodic air hole structure in a two-dimensional plane, and which is constituted by a two-dimensional slab photonic crystal structure in which a linear defect region serving as a waveguide is introduced into the periodic air hole structure. A plurality of regions having different ratios of a hole radius of the air hole structure to a lattice constant of unit lattices that constitute the periodic air hole structure so that segments of the waveguide are connected in series.

An optical device according to still another aspect of the present invention includes a thin film slab structure section in which a slab layer formed by stacking an active layer and cladding layers and spreading two-dimensionally has a periodic refractive index profile structure in a two-dimensional plane, which introduces a linear defect region serving as a waveguide for a laser light to be oscillated into the periodic refractive index profile structure, and which oscillates the laser light, and an optical amplification section having a waveguide formed by stacking an active layer and cladding layers on extension of an extension direction of the linear defect region in the thin film slab structure section; and an electrode which injects a current into the waveguide for optical amplification. The thin film slab structure section and the optical amplification section are formed on a same substrate, and the waveguide in the optical amplification section is processed to suppress reflection of the laser light.

A method of manufacturing an optical device constituted such that a thin film slab structure section in which a slab layer formed by stacking an active layer and an upper and a lower cladding layers and spreading two-dimensionally has a periodic refractive index profile structure in a two-dimensional plane, which introduces a linear defect segment serving as a waveguide for a laser light to be oscillated into the periodic refractive index profile structure, and which oscillates the laser light, and an optical amplification section comprising: a waveguide formed by stacking an active layer and an upper and a lower cladding layers on extension of an extension direction of the linear defect segment of the thin film slab structure section; and an electrode which injects a current into the waveguide for optical amplification, are formed on a same substrate. The lower cladding layers made of compound semiconductor materials different in composition are re-grown in a formation region of the thin film slab structure section and a formation region of the optical amplification section on the substrate, respectively, and the thin film slab structure section and the optical amplification section are formed on the substrate on which the lower cladding layers are re-grown so that the optical waveguide of the thin film slab structure section and the optical waveguide of the optical amplification section are connected substantially continuously.

The other objects, features, and advantages of the present invention are specifically set forth in or will become apparent from the following detailed descriptions of the invention when read in conjunction with the accompanying drawings.

DETAILED DESCRIPTION

Exemplary embodiments of an optical device, an optical device manufacturing method, and a semiconductor laser oscillator according to the present invention will be explained hereinafter in detail with reference to the accompanying drawings. The optical device is a semiconductor laser oscillator, an SOA, an optical modulator, an optical detector, an optical switch device or the like.

Figure 1A:
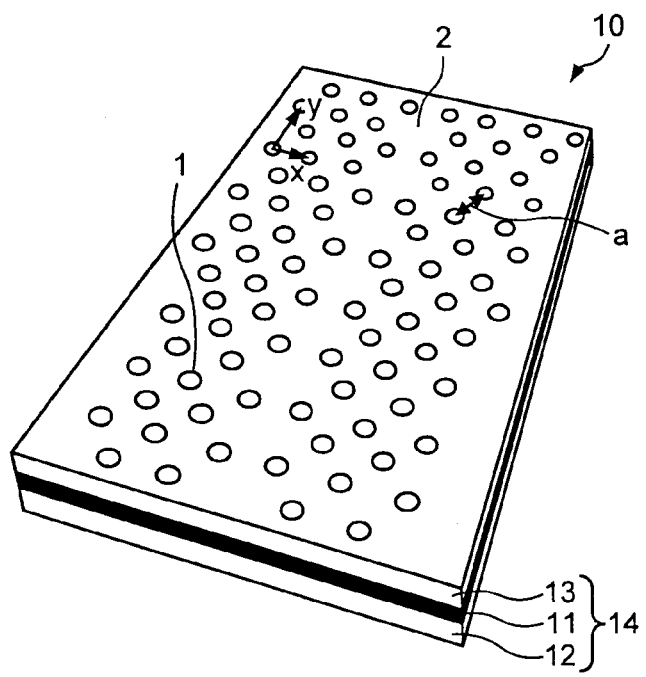
FIG. 1A is a perspective of an optical device according to a first embodiment of the present invention.
Figure 1B:
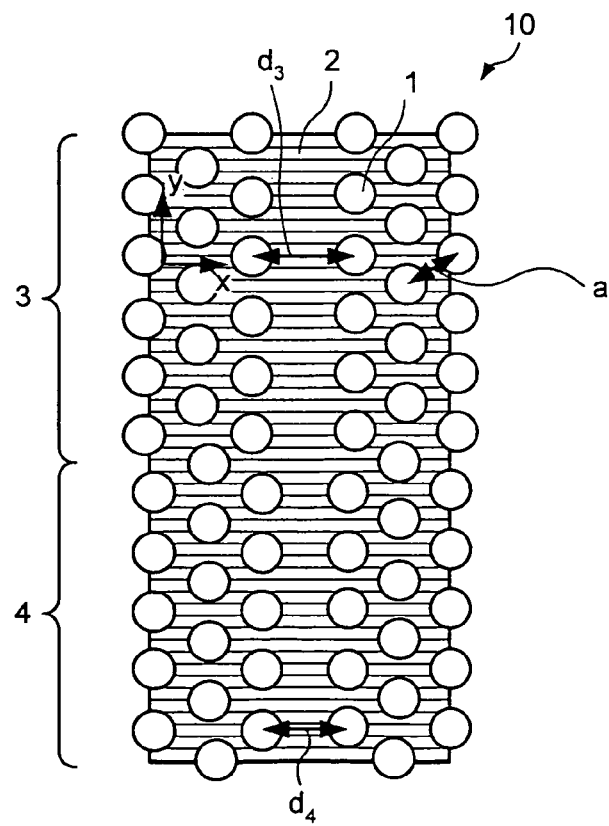
FIG. 1B is a plan view of the optical device according to the first embodiment.

The optical device has a two-dimensional slab photonic crystal structure. An example in which the optical device is employed as the semiconductor laser oscillator will be explained. FIG. 1A and FIG. 1B typically illustrate a waveguide structure of an optical device 10 according to a first embodiment of the present invention. FIG. 1A is a perspective and FIG. 1B is a plan view of the optical device 10.

A slab layer 14 is constituted so that a lower cladding layer 12 made of InGaAsP, an active layer 11 of a multiple quantum well (MQW) structure made of InGaAsP, and an upper cladding layer 13 made of InGaAsP are stacked on a substrate (not shown) made of InP or the like in this order, and a periodic refractive index profile structure is formed in a two-dimensional plane of the slab layer 14 so as to penetrate the slab layer 14 in a direction (hereinafter, "stack direction) of width of the slab layer (14). The periodic refractive index profile structure formed in the slab layer 14 is a triangular lattice air hole structures in FIG. 1A and FIG. 1B. A defect which is a linear deformation of the periodic air hole structure 1 in the two-dimensional plane (a linear defect for the two-dimensional periodic structure) is also formed therein. The linear defect serves as a waveguide 2 in the two-dimensional slab photonic crystal structure. It is assumed herein that in the plane in which a two-dimensional periodic structure as the two-dimensional slab photonic crystal structure is formed, the linear defect extends in a y direction, a direction perpendicular to the y direction is an x direction, a lattice spacing of the air holes that form the triangular lattice is a, and a radius of each air hole is r.

In the optical device 10, width of the waveguide (hereinafter, "waveguide width") is different in different regions. In the present specification, the waveguide width means a distance between centers of the air holes on both sides of the waveguide 2, between which sides the waveguide 2 is put, in the x direction.

As shown in FIG. 1B, two regions 3 and 4 having different waveguide widths are formed in the two-dimensional slab photonic crystal so that the waveguide 2 is connected in series to the regions 3 and 4. Since the region 3 has a structure in which one column is removed from the air hole structure 1 forming the triangular lattice, the waveguide width $d_3$ of the region 3 is $3^{1/2}a$. The waveguide width $d_4$ of the region 4 is slightly smaller than the waveguide width $d_3$ of the region 3 in which one column is removed from the air hole structure 1 forming the triangular lattice, i.e., 1.52a.

FIG. 2A to FIG. 2E are cross-sectional views that typically illustrate a method of manufacturing the two-dimensional slab photonic crystal. In FIG. 2A to FIG. 2E, an example of using a compound semiconductor that includes the active layer 11 and the cladding layers 12 and 13 provided to put upper and lower surfaces of the active layer 11 between them is shown.

On an InP substrate 17, a thin film of an InGaAsP layer that serves as the lower cladding layer 12 having a relatively large energy band gap is grown by a crystal structure system such as a metal-organic chemical vapor deposition (MOCVD) system or a molecular beam epitaxy (MBE) system. A thin film of the active layer 11 having a relatively small energy band gap as compared with that of the lower cladding layer 12, i.e., made of InGaAsP slightly different in composition ratio from the lower cladding layer 12, and including an MQW layer and a barrier layer, is then grown by the crystal growth system such as the MOCVD or MBE system. Thicknesses, the number of layers, and energy band gap values of the MQW layer and the barrier layer determine a light emission wavelength band of the active layer 11. Therefore, the active layer 11 is formed in accordance with the wavelength band of the two-dimensional slab photonic crystal structure and the wavelength band required for the optical device 10 to be manufactured. On the active layer 11, a thin film of an InGaAsP layer that serves as the upper cladding layer 13 having a relatively large energy band gap is grown by the crystal growth system such as the MOCVD or MBE system. A state in which the lower cladding layer 12, the active layer 11, and the upper cladding layer 13 are thus formed on the substrate 17 is shown in FIG. 2A.

Figure 2A:
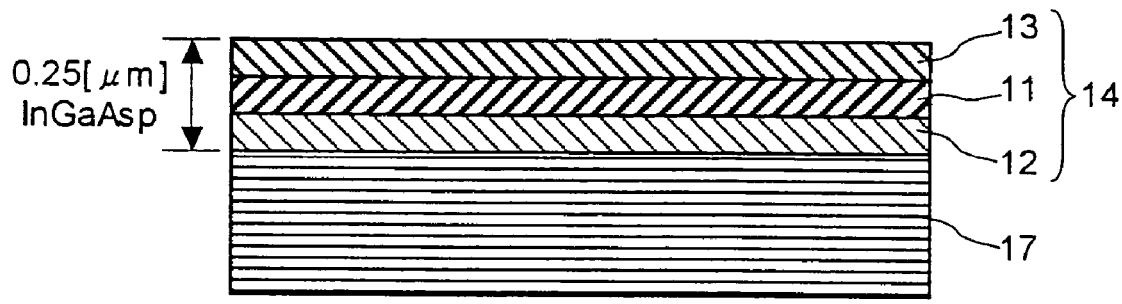
FIG. 2A to FIG. 2E are cross-sectional views that typically illustrates a method of manufacturing a two-dimensional slab photonic crystal.
Figure 2B:
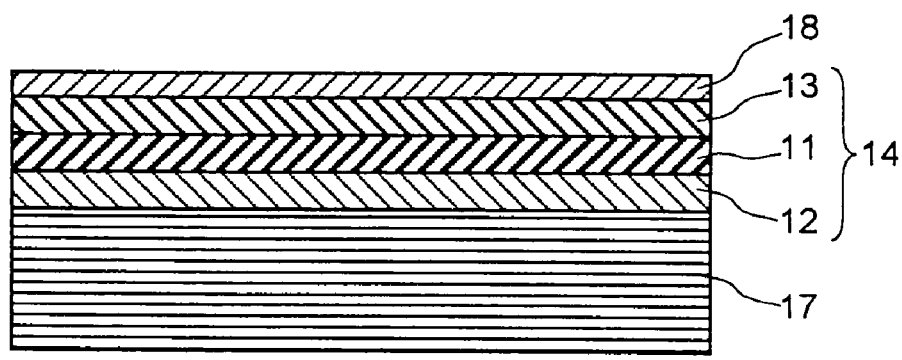

As shown in FIG. 2B, an electron beam (EB) exposure resist 18 made of an organic material is applied on the upper cladding layer 13 made of InGaAsP formed by epitaxial growth on the substrate 17 at the step shown in FIG. 2A.

Figure 2C:
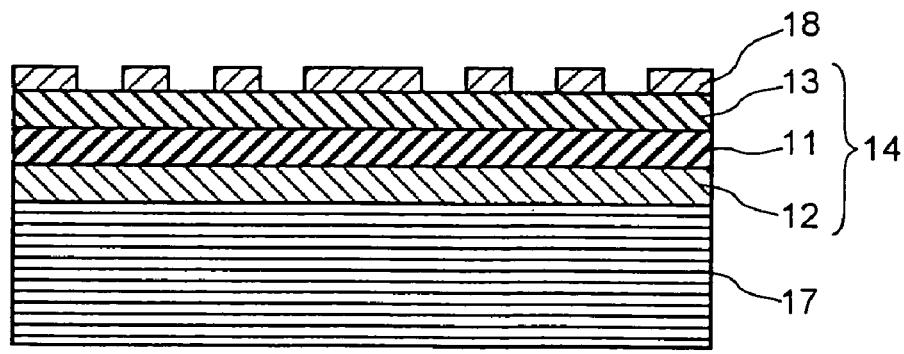

As shown in FIG. 2C, a pattern for forming a refractive index profile structure including a defect structure (which is the periodic air hole structure 1 in the two-dimensional plane in this embodiment) is drawn by an EB exposure system. The EB exposure resist 18 in the region in which the refractive index profile structure is to be formed is removed while the EB exposure resist 18 in the region other than the region is left. The width of the waveguide that is of the defect structure differs between the regions 3 and 4.

Figure 2D:
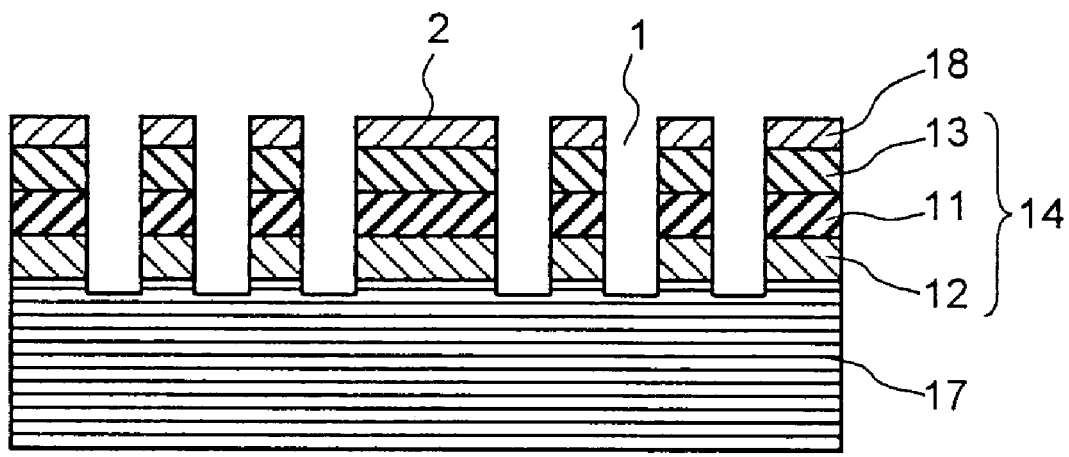

As shown in FIG. 2D, etching is performed up to an upper portion of the substrate 17 to penetrate the slab layer 14 from the upper cladding layer 13 to the InGaAsP layer that is the lower cladding layer 12, by an etching device such as a reactive ion etching (RIE) device or an induced coupled plasma etching (ICP) device, thereby forming the air hole structure 1. At this moment, if the substrate 17 is etched to some extent, a next step of selectively removing a substrate part in a lower portion of the periodic structure can be easily, appropriately executed. Thereafter, the EB exposure resist 18 applied onto the region in which etching has not been performed is removed.

Figure 2E:
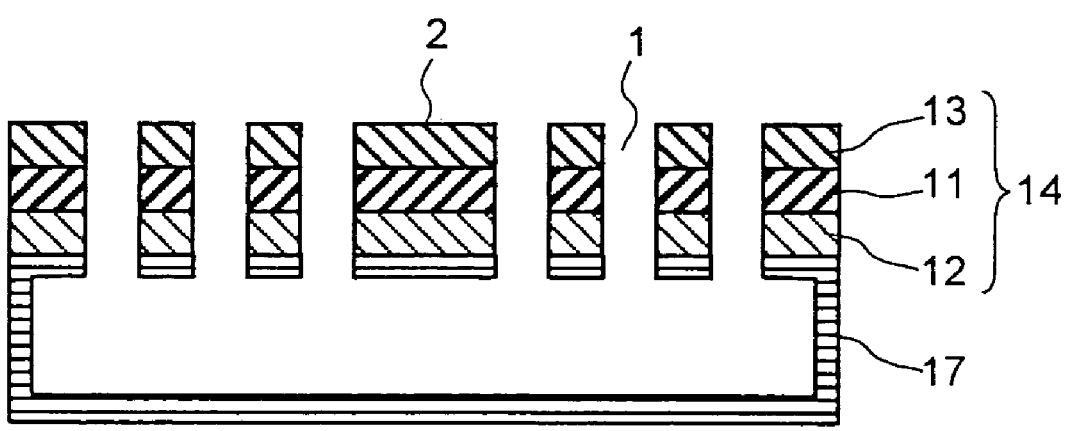

As shown in FIG. 2E, only the substrate 17 part in the lower portion of the air hole structure is selectively removed by wet etching, thereby obtaining the optical device 10 having the two-dimensional slab photonic structure. At this moment, the substrate 17 is in a state in which the substrate 17 is hollow, and a peripheral edge portion of the sheet-like slab layer 14 is supported by the substrate 17. As a result, the upper and lower surfaces of the slab layer 14 contact with the air.

While FIG. 2A to FIG. 2E illustrate an example, the optical device 10 can be manufactured by the other method. For example, a dielectric mask including a dielectric film of $SiN_x$ or $SiO_2$ or of a metallic film of Ti or the like, or a metallic mask layer is deposited on the lower cladding layer 12, the active layer 11, and the upper cladding layer 13 sequentially formed on the substrate 17 shown in FIG. 2A. On the dielectric mask or metallic mask layer, a pattern for forming the refractive index profile structure (which is the periodic air hole structure 1 in this embodiment) having different widths among the regions and including the defect structure is formed by photo-etching process, an EB etching process, or the like. Etching is performed up to the upper portion of the substrate 17 to penetrate the slab layer 14 from the upper cladding layer 13 to the lower cladding layer 12, and only the substrate 17 part that constitutes the lower part of the air hole structure 1 is selectively removed by wet etching for selectively removing the interior of the substrate 17. Finally, the dielectric film or the metallic film in the portion in which etching has not been performed is removed, thereby obtaining the optical device 10 having the two-dimensional slab photonic crystal structure. In this first embodiment, the steps of collectively forming the regions having different waveguide widths are illustrated while the other detailed structure and steps (e.g., a pn junction formation step and an ohmic contact layer necessary for electrode formation) are not illustrated.

It is explained above to use InGaAsP for each of the active layer 11 and the cladding layers 12 and 13. However, any ordinary compound semiconductor can be employed as a material for each of the active layer 11 and the cladding layers 12 and 13. For example, a bulk or an MQW of InGaAs, GaAs, GaP, GaInP, AlGaInP, GaAsP, or GaN can be used as a material for the active layer 11, and GaAs, AlGaAs, AlGaInP, InGaAsP, InP, GaN, or the like can be used as a material for each of the cladding layers 12 and 13.

A laser oscillation operation of the optical device 10 will be explained. The laser oscillation operation if the oscillator has the two-dimensional slab photonic crystal structure having a single wavelength width will first be explained. If a pumping light is irradiated from a laser pumping light irradiation unit or a current is applied to the linear defect of the optical device that has the two-dimensional slab photonic crystal structure, a light is generated in the active layer by recombination of electrons and holes generated in the active layer 11. The light thus generated in the active layer 11 is confined by a configuration in which the active layer 11 and the cladding layers 12 and 13 that are thin material slab regions are put between air claddings, i.e., by refractive index confinement for confining the light in a direction perpendicular (vertical) to each layer surface. The light generated in the active layer 11 is turned into a state in which the light cannot enter a periodic refractive index profile structure region by a photonic band gap due to the periodic refractive index profile structure (which is the triangular lattice-like air hole structure in FIG. 1A and FIG. 1B) in the two-dimensional plane in an in-plane direction parallel to each layer surface. As a result, the light generated in the active layer 11 is locally present in the linear defect region in which the periodic refractive index profile structure is not formed. The linear defect region thus functions as the waveguide 2.

Figure 3:
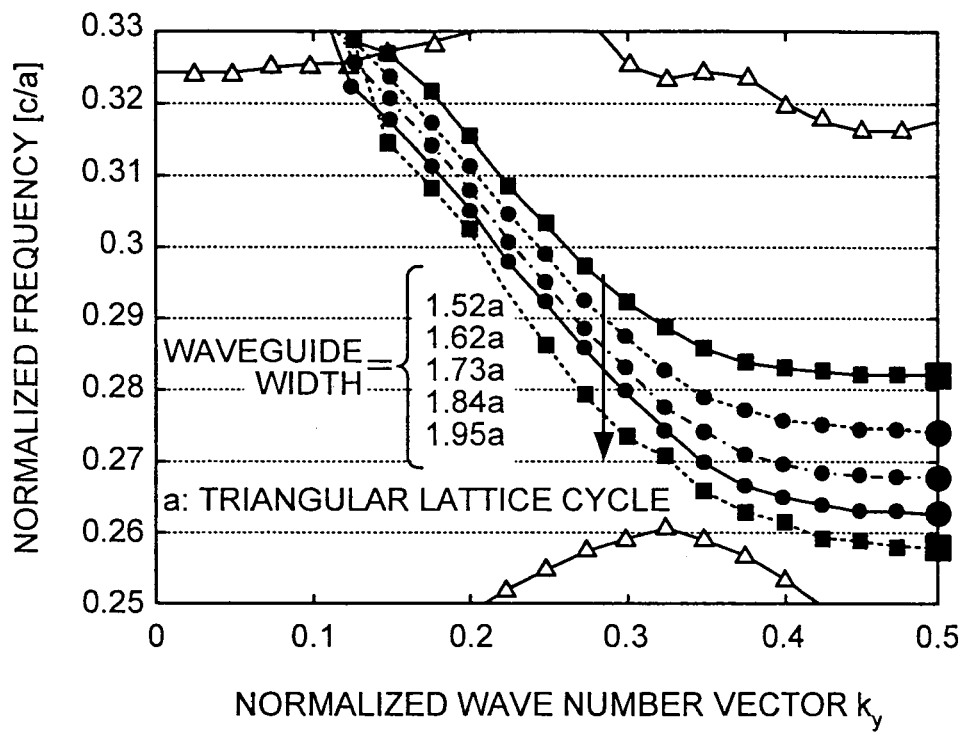
FIG. 3 is an illustration of a change in a band end of a waveguide mode according to a change in a width of a waveguide formed to have a two-dimensional slab photonic crystal structure according to the first embodiment.
Figure 4:
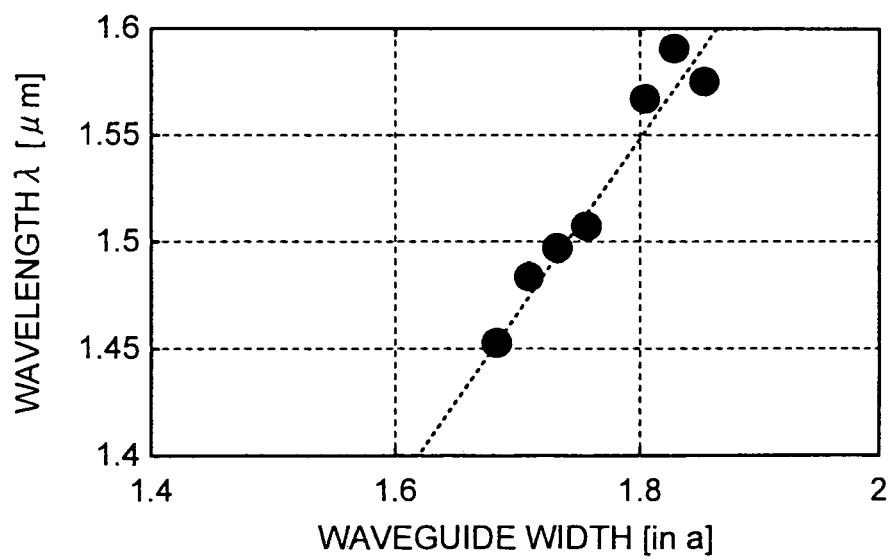
FIG. 4 is an illustration of a change in a laser oscillation wavelength according to a change in the width of the waveguide formed to have two-dimensional slab photonic crystal structure according to the first embodiment.

FIG. 3 is a graph to illustrate a change in a mode band end of the waveguide according to a change in the width of the waveguide formed to have the two-dimensional slab photonic crystal structure according to the present invention. FIG. 4 is a graph to illustrate a change in a laser oscillation wavelength according to a change in an experimentally obtained waveguide width. In a photonic band theory, a mode compatible for the defective waveguide of the photonic band structure could be present in the waveguide 2 in the linear defect region. The light generated in the active layer 11 resonates in a region in which a group velocity on a band end of the waveguide mode of the linear defect is zero. If the two-dimensional slab photonic crystal has only a single waveguide width, part of the resonant laser light is oscillated as a laser light from an end portion of the linear defect region (i.e., the waveguide 2) of the optical device 10.

FIG. 3 illustrates waveguide modes if the waveguide width changes to 1.52a, 1.62a, 1.73a, 1.84a, and 1.95a. Bands obtained by the calculation of a three-dimensional finite difference time domain (hereinafter, "3DFDTD") of zero-degree waveguide modes are shown. Curves of the respective waveguide modes represent that a light having a normalized frequency (normalized wavelength) on the vertical axis of the graph can be present in the photonic band gap. As shown in FIG. 3, by changing the waveguide width, the waveguide mode changes and the oscillation wavelength greatly changes, accordingly. As shown in FIG. 4, normally, as the waveguide width is larger, the wavelength of the laser light oscillated from the end portion of the linear defect region is larger. Therefore, by providing a plurality of regions having different waveguide widths in the two-dimensional slab photonic crystal, laser lights at plurality of wavelengths can be output. In the first embodiment, by filling the air holes with dielectric, a mechanical strength of the optical device 10 can be intensified without greatly changing characteristics of the optical device 10. Although the light confinement effect lowers in the vertical direction and the characteristics of the optical device 10 slightly changes because of stacking a dielectric at least on one side of the slab layer, radiation characteristics and mechanical strength of the optical device 10 improves. Moreover, although the light confinement effect considerably lowers in the vertical direction and the characteristics of the optical device 10 changes because of stacking a semiconductor on at least one side of the slab layer, the radiation characteristics and mechanical strength of the optical device 10 can be improved.

A laser oscillation operation of the optical device 10 having the waveguide 2 of two different widths provided in one two-dimensional slab photonic crystal shown in FIG. 1 will next be explained. As explained, the optical device 10 has the structure in which the region 3 of the waveguide width 1.73a and the region 4 of the waveguide width 1.52a are formed in one two-dimensional slab photonic crystal. As shown in FIG. 4, the optical device 10 can be driven to output laser lights at wavelengths $\lambda_3$ and $\lambda_4$ from the respective regions.

For example, by simultaneously pumping the regions 3 and 4, the laser lights at the different wavelengths $\lambda_3$ and $\lambda_4$ can be emitted from the end portions of the waveguide 2 in a +y direction of the two-dimensional slab photonic crystal. Therefore, the optical device 10 can be employed as a multi-wavelength simultaneous oscillation laser. If so, the oscillation-wavelength of the laser light oscillated in the region 3 having the larger waveguide width does not overlap with the waveguide mode in the photonic band gap region in the region 4 having the smaller waveguide width. For this reason, the laser light cannot be transmitted by the region 4. That is, in the region 3, the laser light is oscillated in the end portion of the band,(a rightmost part on the horizontal axis of the graph) of the waveguide mode at the waveguide width of 1.73a in FIG. 3. The normalized frequency of the laser light (on the vertical axis) does not overlap with that of the curve of the waveguide mode in the region 4 at the waveguide width of 1.52a and the laser light oscillated in the region 3 cannot be present in the region 4. As a result, only the laser light at the wavelength $\lambda_4$ is emitted from the end portion of the waveguide 2 in a −y direction. If the optical device 10 is employed as the multi-wavelength simultaneous oscillation laser and the device 10 is to be constituted not to emit the laser light from one of the end portions of the waveguide 2, it suffices to form the air hole structure 1 in the end portion of the linear defect region from which no laser light is to be emitted so as to conform with the two-dimensional periodic refractive index profile structure formed around the linear defect region.

Further, by turning the regions 3 and 4 into a selectively pumped state, laser lights at desired different wavelengths $\lambda_3$ and $\lambda_4$ can be emitted from the end portions of the waveguide 2 in the +y direction. If so, the optical device 10 can be employed as a wavelength-selectable laser. By pumping the region 4 to have an oscillation threshold or higher and thereby oscillating the laser light at the wavelength $\lambda_4$ and by simultaneously pumping the region 3 to have the oscillation threshold or lower at which the laser light cannot be oscillated at the wavelength $\lambda_3$ only in the region 3, the region 3 can be used as an amplification medium for the wavelength $\lambda_4$. Namely, it is possible to make the region 3 function as the SOA for the laser light output from the region 4. Consequently, the laser light higher in power than the laser light obtained by oscillating the laser light only in the region 4 can be obtained.

Figure 5:
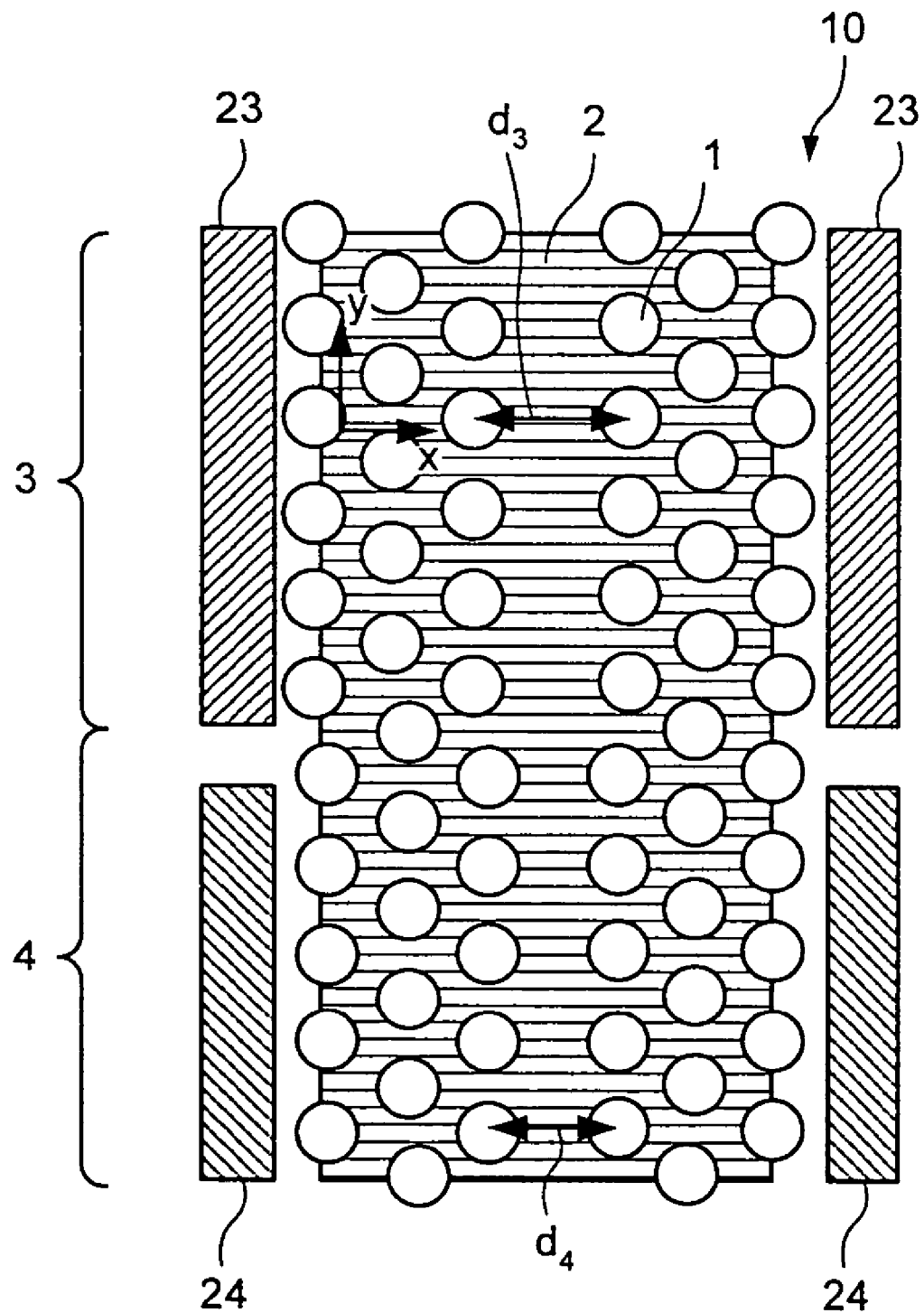
FIG. 5 is a plan view which illustrates an example of a configuration of the optical device.

Such selective pumping can be easily realized by constituting each region to have divided electrodes. FIG. 5 is a plan view of the optical device 10 having electrodes. An electrode 23 is provided on both sides of the region 3 and an electrode 24 is provided on both sides of the region 4. A control unit (not shown) independently controls quantities of currents applied to the electrodes 23 and 24 arranged in the respective regions 3 and 4. It is thereby possible to drive the regions 3 and 4 as semiconductor laser oscillators independent of each other. In addition, the electrodes 23 and 24 thus divided, respectively, are arranged to be substantially in series in two directions. Therefore, it is unnecessary to complicatedly form laser diodes of a wavelength-selectable laser to overlap with one another in a laser diode region arranged in parallel as required in the conventional wavelength-selectable laser but the laser diodes can be connected by patterning without using wires. In FIG. 5, the two electrodes 23 and 24 provided in the extension direction of the waveguide 2 of the two-dimensional slab photonic crystal structure are arranged to be divided in the respective regions 3 and 4. However, it suffices that at least one of the electrodes 23 and 24 is arranged to be divided in the region 3 or 4.

If the optical device 10 is employed as the wavelength-selectable laser and the region 3 can be employed as the amplification medium for the wavelength $\lambda_4$, the region 4 is set to be relatively short in the y direction to the region 3, it is possible to efficiently obtain outputs equal among wavelengths. If the region 3 operates as an absorption medium for the wavelength $\lambda_4$ by a gain region and the design of the oscillator, the region 4 is conversely set to be relatively long in the y direction to the region 3, whereby it is possible to efficiently obtain outputs equal among wavelengths.

According to the first embodiment, the two-dimensional slab photonic crystal having the linear defect introduced into the two-dimensional periodic refractive index profile structure and constituted to include the two regions 3 and 4 having different widths of the linear defect that serves as the waveguide 2 is employed as the optical device 10. Therefore, the electrodes 23 and 24 used to control the respective regions 3 and 4 can be arranged without overlap. As a result, the structure of the optical device 10 can be advantageously simplified and steps of manufacturing the optical device 10 can be advantageously simplified, accordingly.

Furthermore, if the optical device 10 is employed as the tunable laser, it is unnecessary to manufacture the optical device 10 so that laser light sources that output laser lights at different wavelengths are arranged in parallel. Therefore, it is advantageously possible to make the optical device 10 smaller in size than the conventional optical device. Besides, the other region which can transmit the laser light output from one of the regions can be employed as the SOA.

Figure 6:
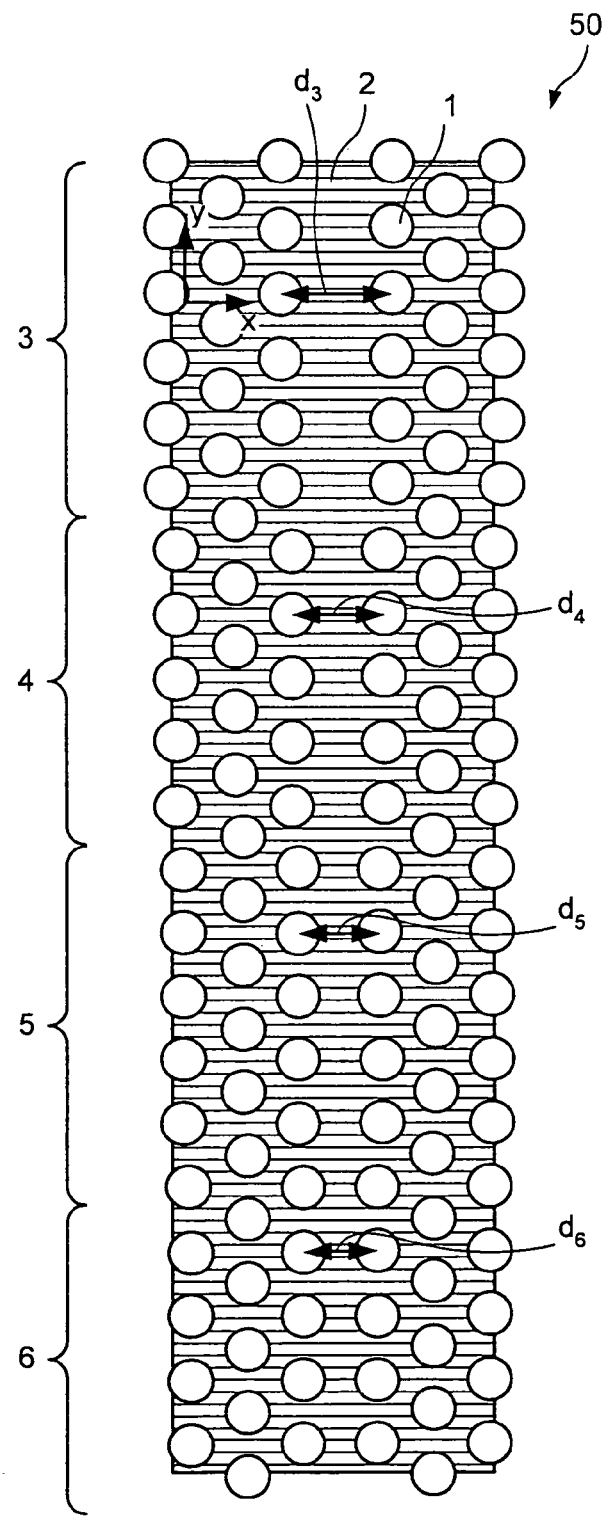
FIG. 6 is a plan view which illustrates a optical device according to a second embodiment of the present invention.

FIG. 6 is a plan view of an optical device according to a second embodiment of the present invention. An optical device 50 shown in FIG. 6 differs from that shown in FIG. 1 in that two regions 5 and 6 having different waveguide widths are additionally provided in the −y direction. Namely, in the two-dimensional slab photonic crystal having the linear defect introduced into the two-dimensional periodic structure, regions 3, 4, 5, and 6 respectively having waveguide widths $d_3$, $d_4$, $d_5$, and $d_6$ ($d_3 > d_4 > d_5 > d_6$) are formed.

When the optical device 50 is employed as the semiconductor laser oscillator, the light resonates in the region in which the group velocity on the band end of the waveguide mode of the linear defect is zero in each of the regions 3 to 6 as explained in the first embodiment. If wavelengths of the laser lights oscillated in the regions 3 to 6 are $\lambda_3$, $\lambda_4$, $\lambda_5$, and $\lambda_6$, respectively, the laser lights at the wavelengths $\lambda_3$ to $\lambda_6$ are output from the +y direction of the optical device 50. It is thereby possible to perform multi-wavelength light oscillation or wavelength-selectable light oscillation. If so, in the same manner to that shown in FIG. 5, by dividing at least one of the electrodes provided in the respective regions 3 to 6, it is possible to prevent the optical device 50 from having the complicated structure in which electrodes overlap. In addition, by setting lengths of the respective regions 3 to 6 in the y direction in view of propagation distance and the balance between gain and absorption, it is possible to efficiently obtain desired outputs of laser lights at different wavelengths.

The optical device 50 in which the four regions 3 to 6 are connected in series in the extension direction of the waveguide 2 is shown. Alternatively, the optical device 10 can be constituted so that an arbitrary number of regions of three or more are connected in series in the direction of extension of the optical waveguide 2. In addition, if the respective regions are driven at currents, the electrodes are arranged on the both end portions of the optical device 50 between which the waveguide 2 of the two-dimensional slab photonic crystal structure is put, respectively, in the extension direction of the optical waveguide 2, and at least one of the electrodes is divided in each region, then the multi-wavelength laser, the wavelength-selectable laser or the tunable laser can be realized.

According to the second embodiment, the two-dimensional slab photonic crystal having the linear defect introduced into the two-dimensional periodic refractive index profile structure and constituted to include three or more regions 3 to 6 having different widths of the linear defect that serves as the waveguide 2, is employed as the optical device 50. Therefore, it is possible to arrange the electrodes used to control the respective regions 3 to 6 without overlap. As a result, the structure of the optical device 50 can be advantageously simplified and steps of manufacturing can be advantageously simplified, accordingly.

When the optical device 50 is employed as the tunable laser, it is unnecessary to manufacture the optical device 50 so that laser light sources that output laser lights at different wavelengths are arranged in parallel. Therefore, it is advantageously possible to make the optical device 50 smaller in size than the conventional optical device. Besides, the other region which can transmit the laser light output from one of the regions can be employed as the SOA.

In the first and the second embodiments, the instances in which the lattice spacing (lattice constant) a and the hole radius r of the two-dimensional periodic refractive index profile structure are invariable in any region and in which the width of the waveguide provided in the two-dimensional periodic refractive index profile structure is changed have been explained. In the third embodiment, an instance in which the lattice constant a of the two-dimensional periodic refractive index profile structure is changed according to the respective regions (while the hole radius to lattice spacing ratio r/a is constant) will be explained.

Figure 7:
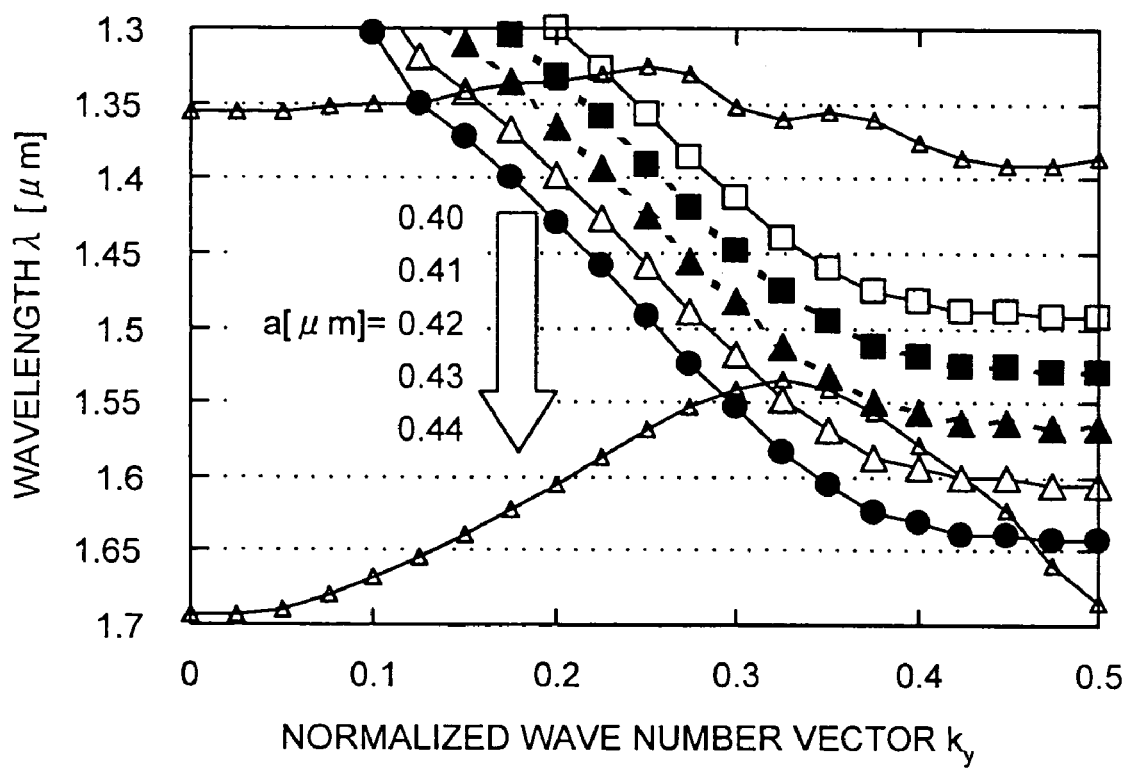
FIG. 7 is an illustration of the band structure of the two-dimensional slab photonic crystal.

The photonic bands in the two-dimensional slab photonic structure shown in FIG. 3 are normalized by the lattice spacing (constant) a of the two-dimensional periodic refractive index profile structure. Therefore, similar results can be obtained between an instance in which the width of the waveguide is changed and an instance in which the lattice constant a of the two-dimensional periodic refractive index profile structure is changed without changing the waveguide width, for one mode, e.g., a mode at a waveguide width of $3^{1/2}a$. Namely, if the lattice constant a is changed, the frequency has no change; however, an actual wavelength changes proportionally to the lattice constant a even with the same band. For example, if the lattice constant a is changed from 0.42 micrometer to 0.45 micrometer, the wavelength changes from 1.5 micrometers to 1.607 micrometers for the same normalized frequency vn=0.28. The band structure that is normalized to the lattice constant a has similar change to that shown in FIG. 3 (see FIG. 7) while the normalized bands are the same. That is, by connecting a plurality of regions having different lattice constants a of the two-dimensional periodic structure, the optical devices 10 or 50 can exhibit the same advantages as those of the first and the second embodiments.

Figure 8:
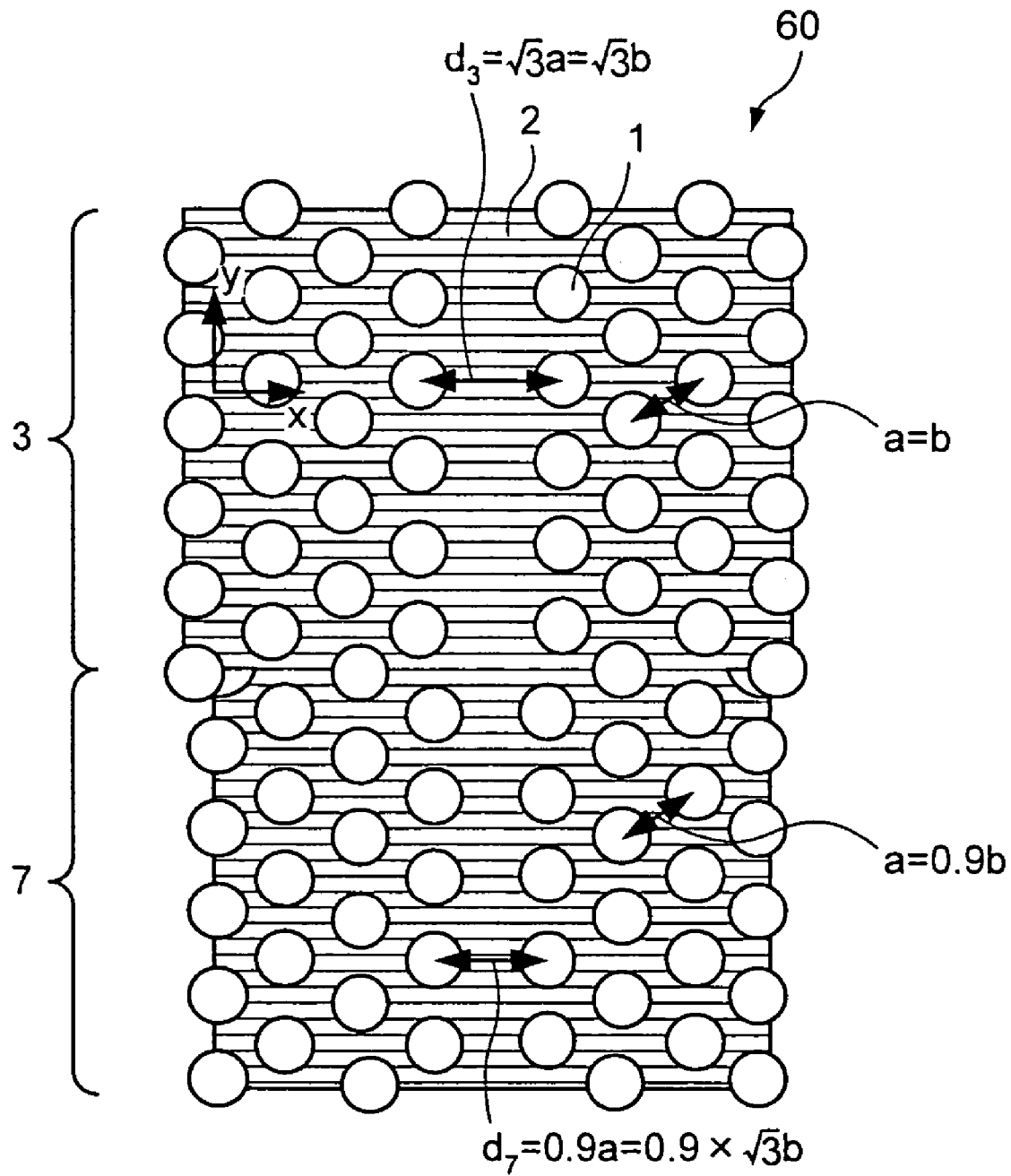
FIG. 8 is a plan view which illustrates an optical device according to a third embodiment of the present invention.

FIG. 8 is a plan of an optical device according to a third embodiment of the present invention. In an optical device 60 shown in FIG. 8, the region 3 having the lattice constant a=b (where b is a certain constant such as 0.42 micrometer) and a region 7 having the lattice constant a=0.9b are connected in series in the two-dimensional slab photonic crystal having the ordinary waveguide width d $(=3^{1/2}a)$ if one column is removed from the periodic triangular lattice-like air hole structure 1. In the optical device 60, in the same manner as the optical devices 10 or 50, the laser light at the wavelength $\lambda_3$ from the region 3 and the laser light at a wavelength $\lambda_7$ from the region 7 are emitted from the end portion of the waveguide 2 on the lattice constant a=b side, i.e., the +y direction whereas only the laser light at the wavelength $\lambda_7$ from the region 7 is emitted from the lattice constant a=0.9b side, i.e., the −y direction.

The optical device 60 has two regions having different lattice constants. Alternatively, three or more regions having different lattice constants may be formed. In addition, as described in the first embodiment with reference to FIG. 5, if the respective regions 3 and 7 are driven at currents, and the electrodes are arranged on the both end portions of the optical device 60 between which the waveguide 2 of the two-dimensional slab photonic crystal structure is put, respectively, in the extension direction of the optical waveguide 2 and at least one of the electrodes is divided in each region, then the multi-wavelength laser, the wavelength-selectable laser or the tunable laser can be realized.

According to the third embodiment, the two-dimensional slab photonic crystal constituted to include a plurality of regions having different lattice constants of the two-dimensional periodic refractive index profile structure formed on both sides of the waveguide 2, is employed as the optical device 60. Therefore, it is possible to arrange the electrodes used to control the respective regions 3 to 6 without overlap. As a result, the structure of the optical device 60 can be advantageously simplified and steps of manufacturing the optical device 60 can be advantageously simplified, accordingly.

When the optical device 60 is employed as the tunable laser, it is unnecessary to manufacture the optical device 60 so that laser light sources that output laser lights at different wavelengths are arranged in parallel. Therefore, it is advantageously possible to make the optical device 60 smaller in size than the conventional optical device.

Figure 9:
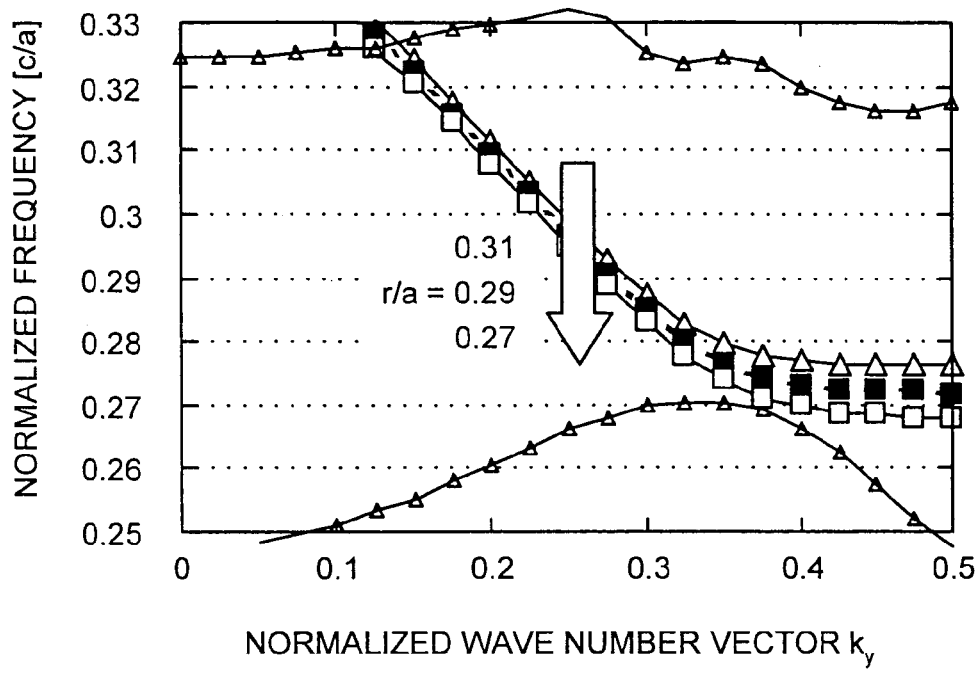
FIG. 9 is an illustration of the band structure of the two-dimensional slab photonic crystal.

In a fourth embodiment, only the hole radius to lattice spacing ratio r/a may be is changed without changing the lattice constant a of the two-dimensional periodic refractive index profile structure. Even with this configuration, the optical devices 10, 50, and 60 exhibit the same advantages as those of the first to the third embodiments. That is, if the hole radius to lattice spacing ratio r/a is changed, the normalized frequency is changed. If the hole radius to lattice spacing ratio r/a is changed to, for example, 0.31, 0.29, and 0.27, the modes change as shown in the band diagrams shown in FIG. 9. Accordingly, the optical devices 10, 50, and 60 can exhibit the same advantages as those of the first and the second embodiments, in particular, and similar advantages to those of the third embodiment. Needless to say, the first to the fourth embodiments can be combined.

Figure 10:
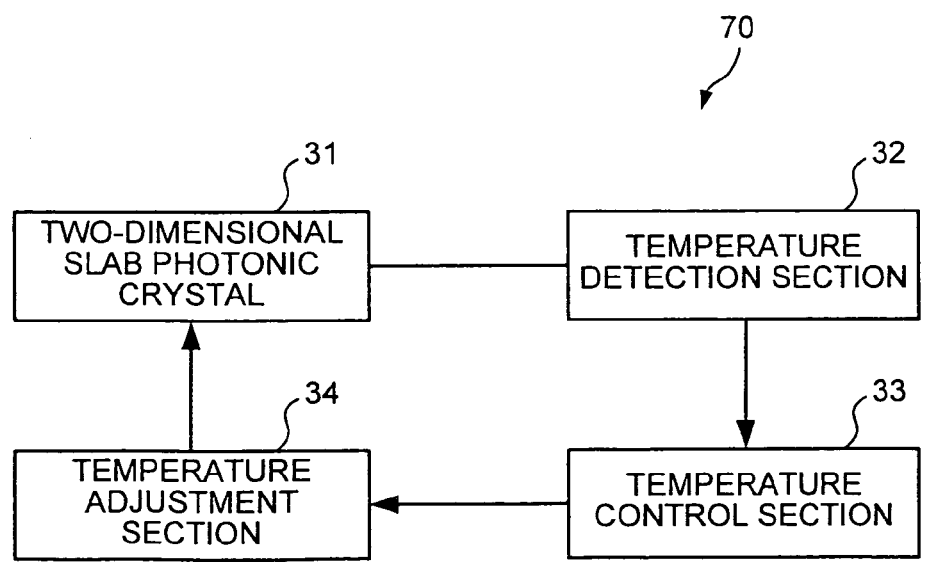
FIG. 10 is a block diagram of an optical device according to a fifth embodiment of the present invention.

FIG. 10 is a functional block diagram of an optical device according to a fifth embodiment of the present invention. An optical device 70 according to the fifth embodiment includes a two-dimensional slab photonic crystal 31 constituted as explained in the first to the fourth embodiments, a temperature detection section 32 which detects a temperature of the two-dimensional slab photonic crystal 31, a temperature control section 33 which controls the temperature of the two-dimensional slab photonic crystal 31 to a desired temperature, and a temperature adjustment section 34 which changes the temperature of the two-dimensional slab photonic crystal 31 according to an instruction from the temperature control section 33.

As explained in the first to the third embodiments, the two-dimensional slab photonic crystal 31 is constituted to be able to output a plurality of laser lights at different wavelengths. The temperature detection section 32 functions to detect the temperature of the two-dimensional slab photonic crystal 31 and to output the detection result to the temperature control section 33. As the temperature detection section 32, a well-known temperature detection unit such as a unit that detects the temperature of the two-dimensional slab photonic crystal 31 by adding a thermocouple or the like to the two-dimensional slab photonic crystal 31, or a unit that demultiplexes part of the laser light-output from the two-dimensional slab photonic crystal 31 and that measures a wavelength of the demultiplexed laser light, thereby detecting the temperature of the two-dimensional slab photonic crystal 31 can be used.

The temperature control section 33 functions to control the temperature adjustment section 34 based on the temperature information obtained from the temperature detection section 32 so that the two-dimensional slab photonic crystal 31 has a desired temperature. The temperature adjustment section 34 heats or cools the two-dimensional slab photonic crystal 31 based on the instruction from the temperature control section 33. As the temperature adjustment section 34, a Peltier element or the like can be used.

It is possible to obtain not only the different wavelengths obtained by changing the width of the waveguide 2 introduced into the two-dimensional periodic refractive index profile structure explained in the first to the third embodiments for each region or changing the lattice constant of the two-dimensional periodic refractive index profile structure relative to the predetermined waveguide width using the optical device 70 thus constituted, but also further different wavelengths by the temperature change of the two-dimensional slab photonic crystal 31. Besides, if a laser light at a predetermined wavelength is to be obtained, a laser device capable of controlling the wavelength more finely can be employed.

According to the fifth embodiment, it is possible to obtain not only the different wavelengths obtained by changing the width of the waveguide 2 introduced into the two-dimensional periodic refractive index profile structure for each region or changing the lattice constant of the two-dimensional periodic refractive index profile structure relative to the predetermined waveguide width using the optical device 70 thus constituted, but also further different wavelengths by the temperature change of the two-dimensional slab photonic crystal 31.

Figure 11A:
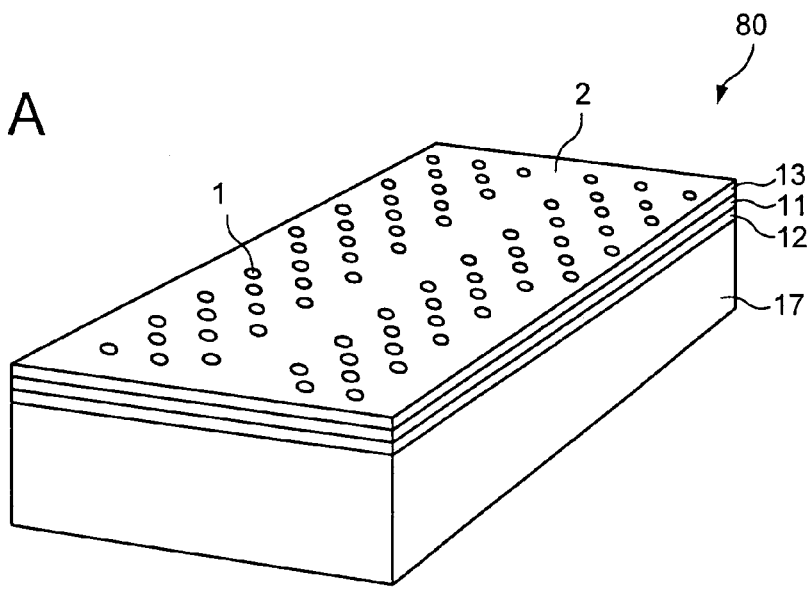
FIG. 11A is a perspective of an optical device according to a sixth embodiment of the present invention.
Figure 11B:
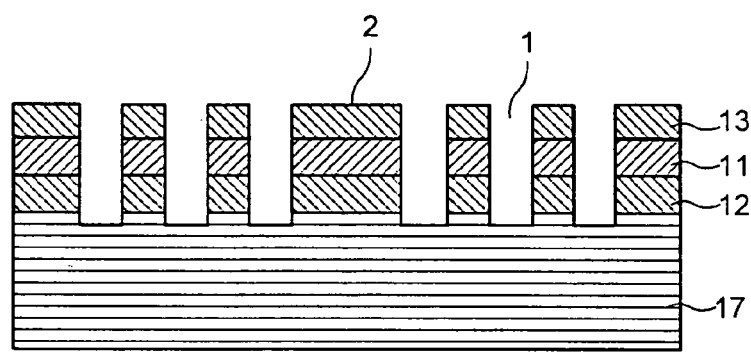
FIG. 11B and FIG. 11C are cross-sectional views of an optical device according to the sixth embodiment.
Figure 11C:
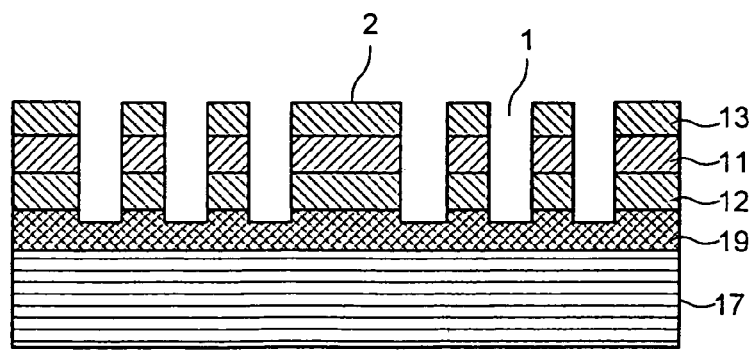

FIG. 11A to 11C are illustrations of an optical device according to a sixth embodiment of the present invention.

FIG. 11A is a perspective and FIG. 11B and FIG. 11C are cross-sectional views of an optical device 80 according to the sixth embodiment. The optical device 80 has the slab layer 14 including the lower cladding layer 12, the active layer 11, and the upper cladding layer 13 on the substrate 17 and has the two-dimensional periodic refractive index profile structure including the linear defect in the slab layer 14. The triangular lattice-like air hole structure penetrating the slab layer 14 from the upper cladding layer 13 until at least the lower surface of the lower cladding layer 12 is formed as the two-dimensional periodic refractive index profile structure. In addition, the waveguide 2 constituted as the linear defect has an equal width over-the entire surface of the slab layer 14 and the air hole structure 1 has an equal lattice constant over the entire surface of the slab layer 14 in the example of FIG. 9.

The optical device 80 is manufactured as follows. As shown in FIG. 2A to FIG. 2C, the slab layer 14 including the lower cladding layer 12, the active layer 11, and the upper cladding layer 13 is formed on the substrate 17 by a thin film formation technique, and the pattern for forming the two-dimensional periodic refractive index profile structure including the defect structure is formed by photolithography. As shown in FIG. 2D, the air hole structure 1 penetrating the slab layer 14 substantially in a perpendicular direction to the layer surface is formed in accordance with the formed pattern by the etching device. It suffices that the air hole structure 1 may penetrate the slab layer 14 from the upper cladding layer 13 to the lower cladding layer 12. As shown in FIG. 2D, the air hole structure 1 may be formed deep to reach the substrate 17. The exposure resist 18 applied onto the region in which etching has not been performed is removed. The optical device 80 is thereby obtained.

The width of the waveguide formed in the slab layer 14 is equal and the lattice constant of the lattice that constitutes the two-dimensional periodic refractive index profile structure is equal over the entire surface of the slab layer 14. However, if the optical device 80 is employed as the multi-wavelength laser, the tunable laser, or the wavelength-selectable laser, the optical device 80 may be constituted to arrange a plurality of regions at different wavelength widths so as to connect segments of the waveguide 2 in series as shown in FIG. 1B or FIG. 6 or to arrange a plurality of regions at different lattice constants so as to connect the segments of the waveguide 2 in series. If the optical device 80 is so constituted, the pattern may formed so that the respective regions have different widths of the optical waveguide serving as the defect structure when the pattern for forming the two-dimensional periodic refractive index profile structure including the defect structure is formed or the pattern may be formed so that the respective regions have different lattice constants of the air hole structure that constitutes the two-dimensional periodic refractive index profile structure while setting the waveguide width at a predetermined value.

An Al-containing semiconductor layer 19 may be formed between the substrate 17 and the lower cladding layer 12 as shown in FIG. 11C. A selective oxidation step is executed to oxidize the Al-containing semiconductor layer 19 that contacts with the slab layer 14, thereby obtaining a dielectric. In this embodiment, it is possible to confine light by the difference in refractive index between the semiconductor (having a refractive index of about 3.3 to 3.5) and the dielectric (having a refractive index of about 1.5) although the effect of the light confinement is inferior to that realized by the difference in refractive index between the slab layer 14 and the air. As compared with the slab structure put between the air layers, the radiation characteristics and mechanical strength of the optical device 80 can be greatly improved.

According to the sixth embodiment, the slab layer 14 is formed on the substrate 17. Therefore, a heat generated by the laser light oscillated in the waveguide 2 formed in the slab layer 14 can be diffused through the substrate 17 and thermal characteristics of the optical device 80 can be thereby, advantageously improved.

Figure 12A:
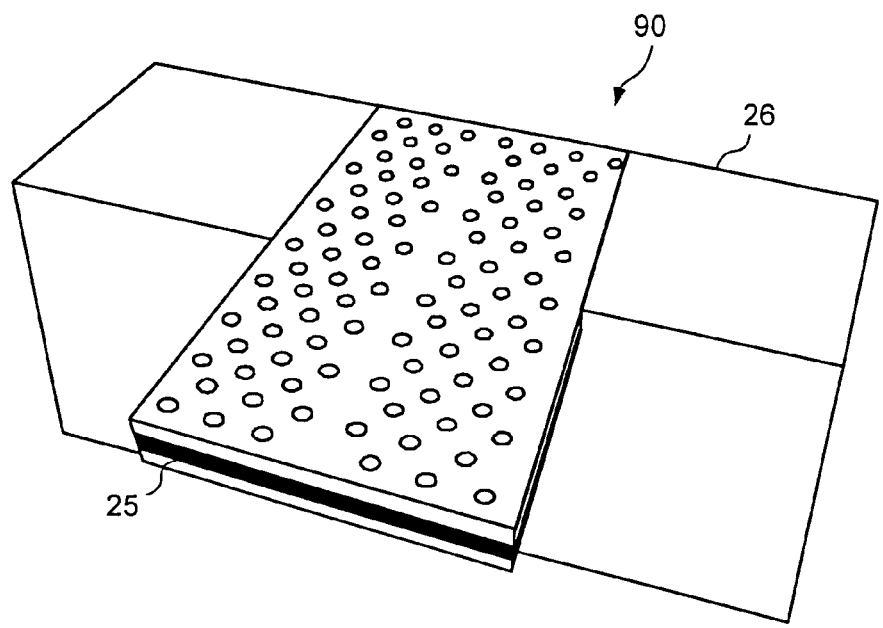
FIG. 12A to FIG. 12D are perspectives of an optical device according to a seventh embodiment of the present invention.

FIG. 12A is an illustration of an optical device according to a seventh embodiment of the present invention. In an optical device 90 according to the seventh embodiment, a thin film slab structure section 25 and a thick film periodic hole structure section 26 are connected in series. The slab layer 14 determines the laser oscillation characteristics of the optical device 90, while the thick film periodic hole structure section 26 not only obtains power but also improves the radiation characteristics and mechanical strength of the optical device 90.

Figure 12B:
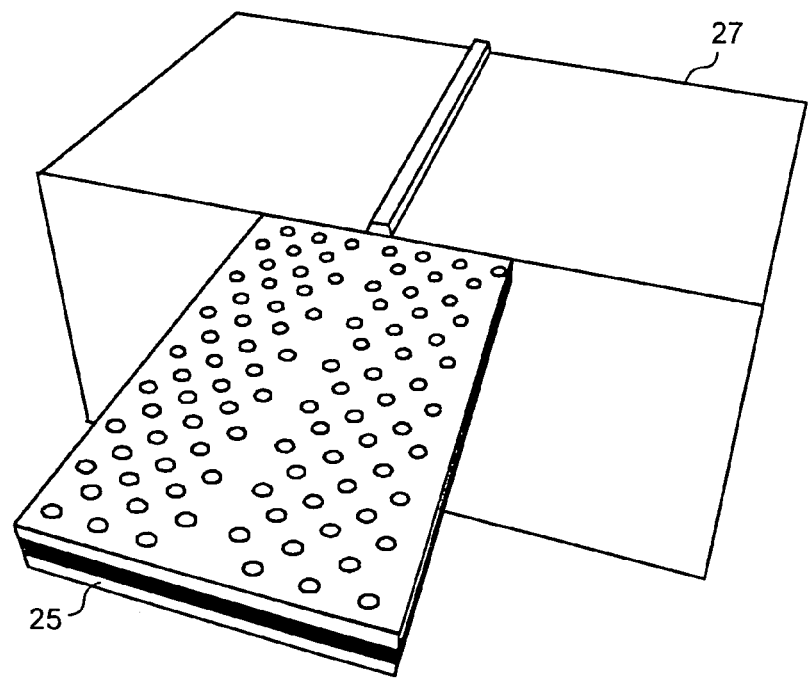
Figure 12C:
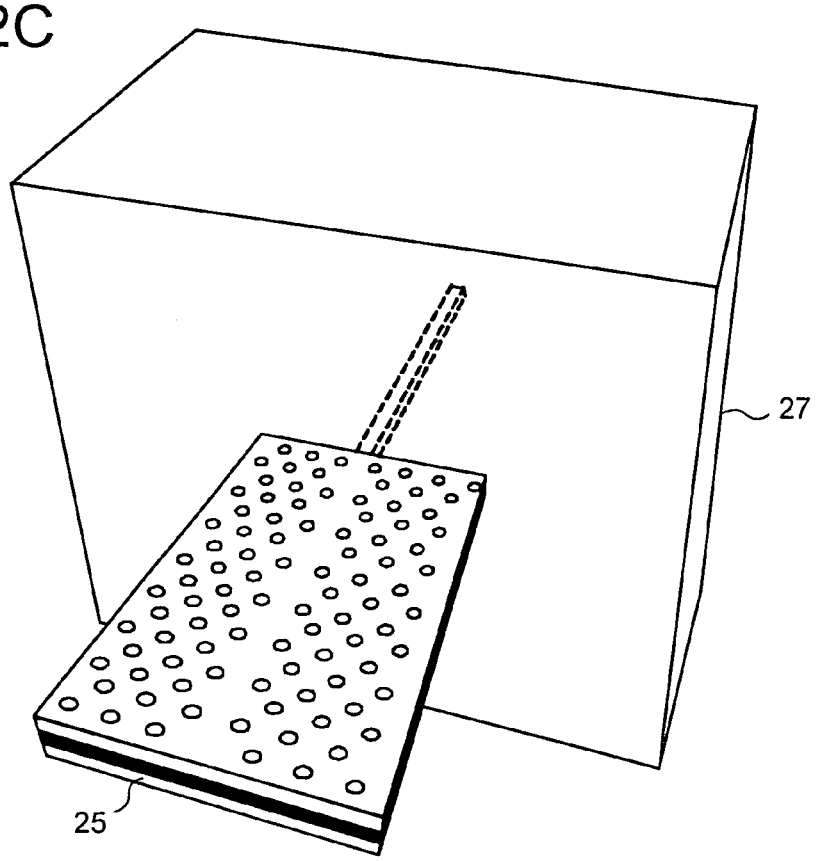

By using a selectively oxidized dielectric section as a lower cladding contact section in the thick film periodic hole structure section 26 shown in FIG. 12A, it is possible to suppress the deterioration of the optical characteristics of the thick film periodic hole structure section 26. FIG. 12B illustrates that a thick film structure section 27 has a ridge refractive index waveguide structure, which exhibits the same advantages as those of the preceding embodiments. FIG. 12C illustrates that the thick film structure section 27 has a refractive index waveguide structure, which exhibits the same advantages as those of the preceding embodiments, as well. The thin film slab structure section 25 and the thick film structure section 27 can be manufactured by selective etching or by using a mask.

Figure 12D:
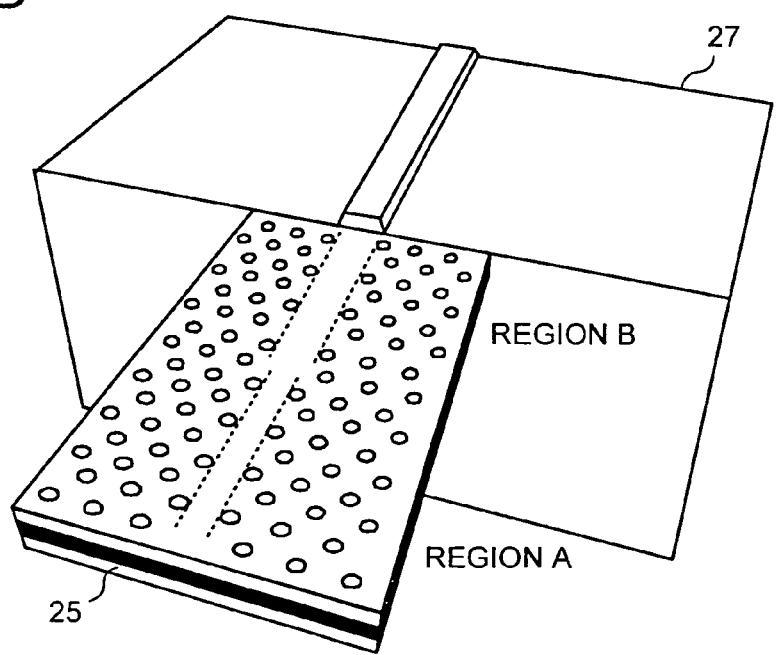

In the example of FIG. 12A to FIG. 12C, the width of the waveguide formed in the slab layer 14 is equal and the lattice constant of the lattice that constitutes the two-dimensional periodic refractive index profile structure is equal over the entire surface of the slab layer 14 to the thick film periodic hole structure section 26. Alternatively, the waveguide 2 may be constituted to arrange a plurality of regions at different wavelength so as to connect the segments of the waveguide 2 in series as shown in the plan view of the two-dimensional periodic refractive index profile structure of FIG. 12D. If the optical device 90 is so constituted, the pattern may formed so that the respective regions have different widths of the optical waveguide serving as the defect structure when the pattern for forming the two-dimensional periodic refractive index profile structure including the defect structure is formed. Further, the waveguide 2 may be constituted to arrange a plurality of regions at different lattice constants so that the segments of the waveguide 2 are connected in series as shown in the plan view of the two-dimensional periodic refractive index profile structure of FIG. 8. If the optical device 90 is so constituted, the pattern may be formed so that the respective regions have different lattice constants of the air hole structure that constitutes the two-dimensional periodic refractive index profile structure.

The optical device 90 is constituted so that the slab layer 14 is connected in series to the thick film periodic hole structure section 26 or the thick film structure section 27. Therefore, it-is advantageously possible to prevent the laser light oscillated in the waveguide 2 from concentrating on the waveguide 2 and improve the thermal characteristics of the optical device.

It is assumed in the first to the seventh embodiments that the laser light emission port is in the end portion of the waveguide 2. Alternatively, the optical device can be constituted so that one or more point defects are introduced into the two-dimensional periodic refractive index profile structure and so that the laser light can be output from the point defects by a method such as method in which the air hole structure 1 is not formed at a position proximate to the waveguide 2 in the two-dimensional periodic refractive index profile structure or a method in which hole structures having different hole radius to lattice constant ratios r/a are formed.

The optical device can be employed as the SOA by selectively utilizing the difference in waveguide mode or particularly the region in which the waveguide mode is not present, the optical device 10. Further, the optical device 10 can be employed as the modulator that makes use of the effect of a change in optical absorption quantity according to a change in a quantity of an electric field applied to a pn junction. In the latter case, if the region 4 shown in FIG. 5 is used, for example, as a laser oscillation region and an opposite bias voltage applied to the MQW of the region 3 is controlled to be on and off, an optical absorption coefficient of the MQW can be changed and the laser light oscillated in the region 4 can be thereby modulated.

The optical device can be employed as the detector. If so, the optical device constituted as explained in one of the first to the sixth embodiments is employed as the waveguide between a transmission medium such as an optical fiber and the detector. The optical device used therein functions as a filter that introduces a light transmitted through the transmission medium to the detector and that transmits only the light at a predetermined wavelength. For example, as shown in FIG. 5, if the divided electrodes provided in each of the regions 3 and 4 having different waveguide widths are used and currents are carried to the electrodes, the optical device can select only the light at the predetermined wavelength as an active device. In FIG. 1A, the instance in which the active layer 11 is present in the slab layer 14 has been shown. However, if no active layer 11 is present therein, the wavelength of the light introduced to the detector can be selected by determining which of the regions having different waveguide widths is to be arranged toward the detector. The selection and determination are made using the property of the laser light that the laser-light generated in the region 4 having the larger waveguide width cannot be transmitted by the region 3 having the smaller waveguide width as explained in the first embodiment. In addition, if the optical device is employed as the waveguide that introduces the light to the detector, then the point defect may be introduced near the waveguide 2 in the two-dimensional refractive index structure, a laser light at a predetermined wavelength may be output from the point defect and the output laser light may be introduced to the detector without outputting the light from the side end portion of the waveguide 2 of the optical device to the detector.

Figure 13:
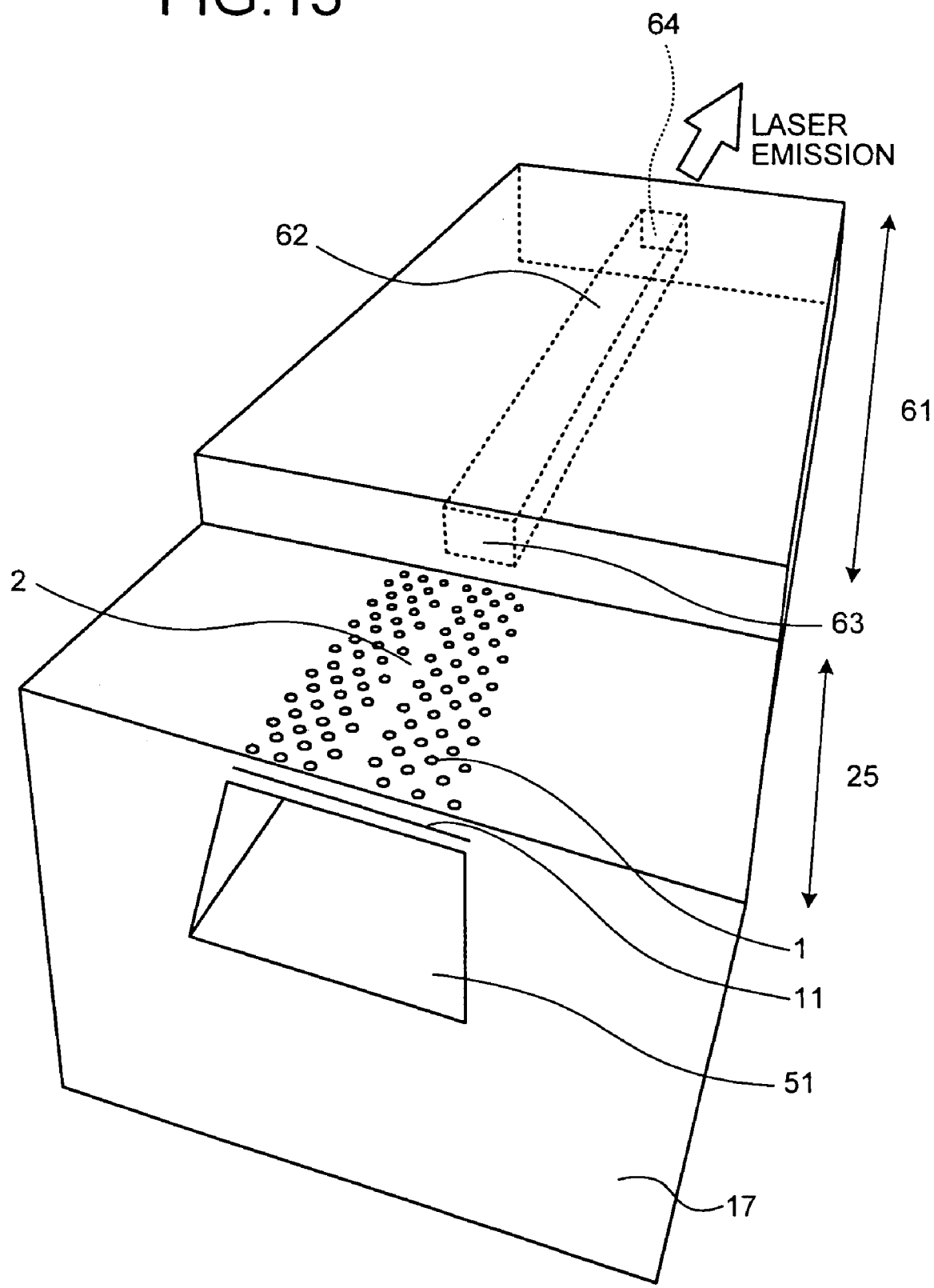
FIG. 13 is a perspective of an optical device according to an eighth embodiment-of the present invention.

FIG. 13 is a perspective of an optical device according to an eighth embodiment of the present invention. This optical device is constituted so that the thin film slab structure section 25 composed of the two-dimensional slab photonic crystal structure and an optical amplification section 61 that amplifies a laser light oscillated in the thin film slab structure section 25 are arranged with respective waveguides connected in series.

The thin film slab structure section 25 is constituted as follows. A periodic refractive index profile structure (air holes 1) is formed in a two-dimensional plane of a slab layer constituted so that the lower cladding layer, the active layer 11 of the MQW structure or the like, and the upper cladding layer are stacked on the substrate 17 in this order. A linear defect serving as the waveguide 2 is introduced into the periodic refractive index profile structure, and the substrate part present in the lower portion of the slab layer that forms the refractive index profile structure is removed. The linear defect introduced into the periodic refractive index profile structure may be such that a defect having an equal width is formed from one end of the thin film slab structure to the other end thereof or may have the structure explained in the first to the sixth embodiments. A thickness of the slab layer is preferably a submicron-order thickness. The structure of this thin film slab structure section 25 is basically equal to that of the two-dimensional slab photonic crystal structure explained in the first embodiment. Therefore, the structure will not be explained herein in detail.

The optical amplification section 61 is equal in structure to the SOA. That is, the optical amplification section 61 includes a waveguide 62 constituted so that a lower cladding layer, an active layer of the MQW structure or the like, and an upper cladding layer are stacked on the substrate 17 in this order, and an electrode for injecting a current into this waveguide 62 to amplify an optical signal. The electrode is not shown in FIG. 13. In addition, the optical amplification section 61 having a buried waveguide structure is shown in FIG. 13. Alternatively, the optical amplification section 61 may have a ridge waveguide structure.

The waveguide 62 in the optical amplification section 61 is formed on extension of the waveguide 2 formed in the thin film slab structure section 25. Since the optical amplification section 61 has the buried waveguide structure, an instance in which an upper surface of the optical amplification section 61 is higher than that of the waveguide 2 of the thin film slab structure section 25 is shown in FIG. 13. Namely, there is a difference in height on a boundary between the thin film slab structure section 25 and the buried optical amplification section 61. An end portion of the waveguide 62 which does not contact with the thin film slab structure section 25 is a laser light emission section 64. An end portion of the waveguide 62 on the thin film slab structure 25 side is provided with a window 63 which does not have the optical waveguide structure. A propagation mode of the waveguide 62 of the optical amplification section 61 has a structure wider than the defect waveguide 2. Therefore, a probability that the laser light propagated in the waveguide 62 is reflected by the boundary between the optical amplification section 61 and the thin film slab structure section 25 increases. By providing the window 63 that does not have the waveguide structure in a part of the thin film slab structure section 25-side end portion of the waveguide 62, the reflection of the laser light by the end portion of the waveguide 62 is reduced. Namely, the reflection of the laser light by the end portion is reduced by the window 63 which does not have the waveguide structure so that the optical amplification section 61 for outputting a high power laser light can be solely turned into a strongly pumped state exceeding an oscillation threshold, and so that the optical amplification section 61 does not operate solely as a resonator.

The emission section 64-side end portion of the optical amplification section 61 can also be provided with a window. If so, the reflection of the laser light by the emission section 64 can be also reduced, making it possible to further effectively suppress the optical amplification section 61 from oscillating the laser light independently. As long as the reflection by the end portion of the waveguide 62 can be suppressed, an anti-reflection coating may be applied to the end portion of the optical amplification section 61 instead of providing the window 63 which does not have the waveguide structure. Further, both the window 63 which does not have the waveguide structure and the antireflection coating may be provided. By doing so, it is possible to far more effectively suppress the optical amplification section 61 from oscillating the laser light independently.

According to the eighth embodiment, the optical device is constituted to include the thin film slab structure section 25 and the optical amplification section 61 so that their respective waveguides 2 and 62 are connected in series. Therefore, the laser light generated in the thin film slab structure section 25 can be amplified by the optical amplification section, and the laser light with high power can be oscillated. Besides, the end portion of the optical amplification section 61 includes the window 63 which does not have the buried waveguide structure or the antireflection coating. Therefore, it is possible to suppress the optical amplification section 61 from acting as a resonator and oscillating the laser light independently.

Figure 14:
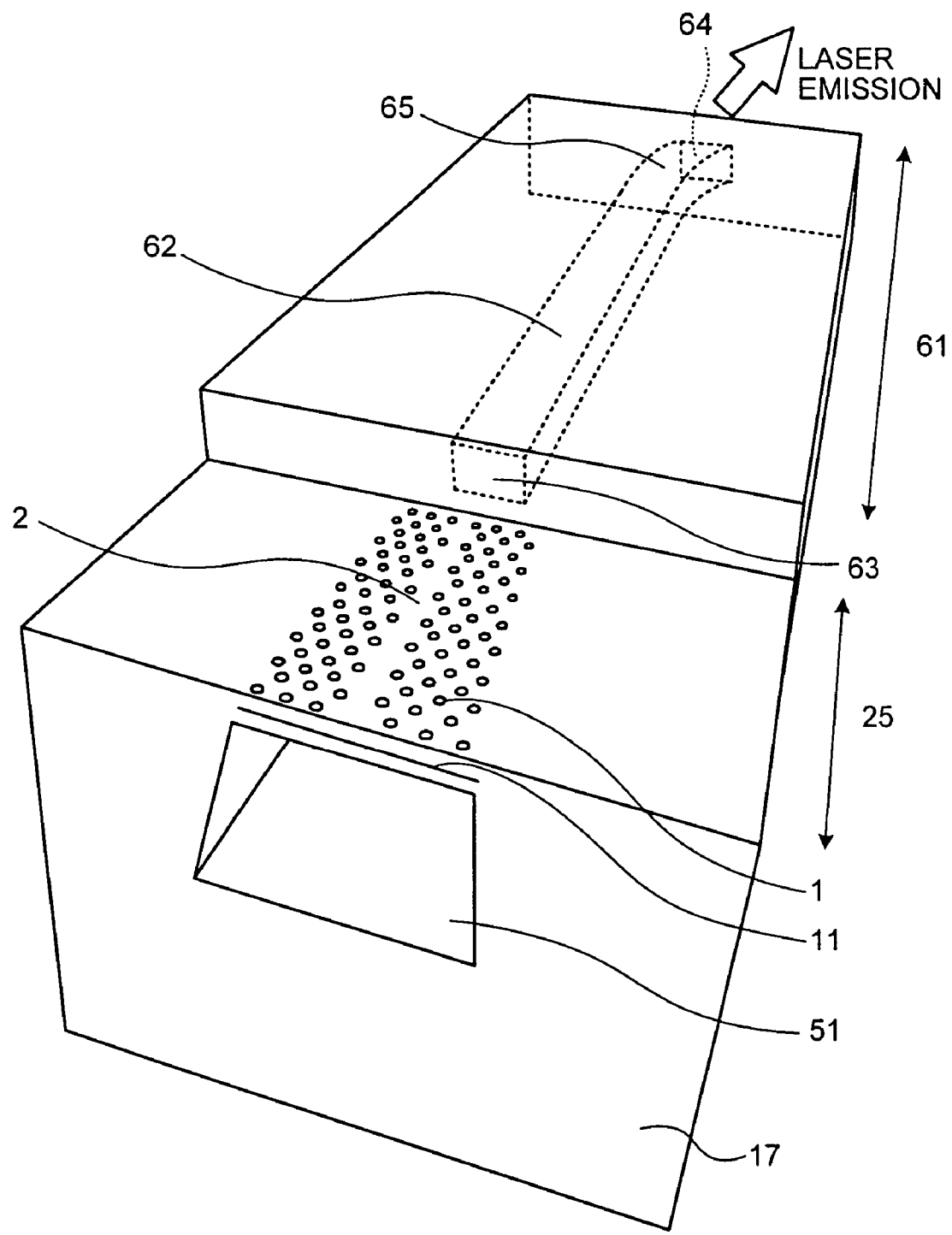
FIG. 14 is a perspective of an optical device according to a ninth embodiment of the present invention.

FIG. 14 is a perspective of an optical device according to a ninth embodiment of the present invention. With the optical device shown in FIG. 14, a curved structure 65 is introduced in an emission section 64-side end portion of the linear waveguide 62 in the optical amplification section 61. By curving the emission 64-side end portion of the waveguide 62, the reflection of the laser light by the emission section 64-side end portion can be suppressed, and the optical amplification section 61 can be suppressed from operating as a resonator independently.

In FIG. 14, an instance in which the curved structure 65 is introduced in the emission section 64-side portion of the linear waveguide 62 in the optical amplification section 61 is shown. Alternatively, the curved structure 65 may be introduced in a portion of the optical amplification section 61 near the thin film slab structure section 25. In addition, an instance in which the window 63 which does not have the waveguide structure is provided in the end portion of the waveguide 62 in the optical amplification section 61 in which the optical amplification section 61 is connected to the thin film slab structure section 25 is shown. Alternatively, an antireflection coating may be provided in, for example, the end portion of the optical waveguide 62 instead of the window 63 so as to suppress the optical amplification section 61 from oscillating the laser light independently. Further, similarly to the eighth embodiment, the window 63 which does not have the waveguide structure or both the window 63 and the antireflection coating may be provided in each end portion of the waveguide 62 in the optical amplification section 61.

According to the ninth embodiment, the optical waveguide is constituted so that the emission section 64-side end portion of the linear waveguide 62 in the optical amplification section 61 is curved. Therefore, it is possible to suppress the reflection of the laser light by the end portion of the waveguide 62, and output the laser light generated in the thin film slab structure section 25 with high power.

Figure 15A:
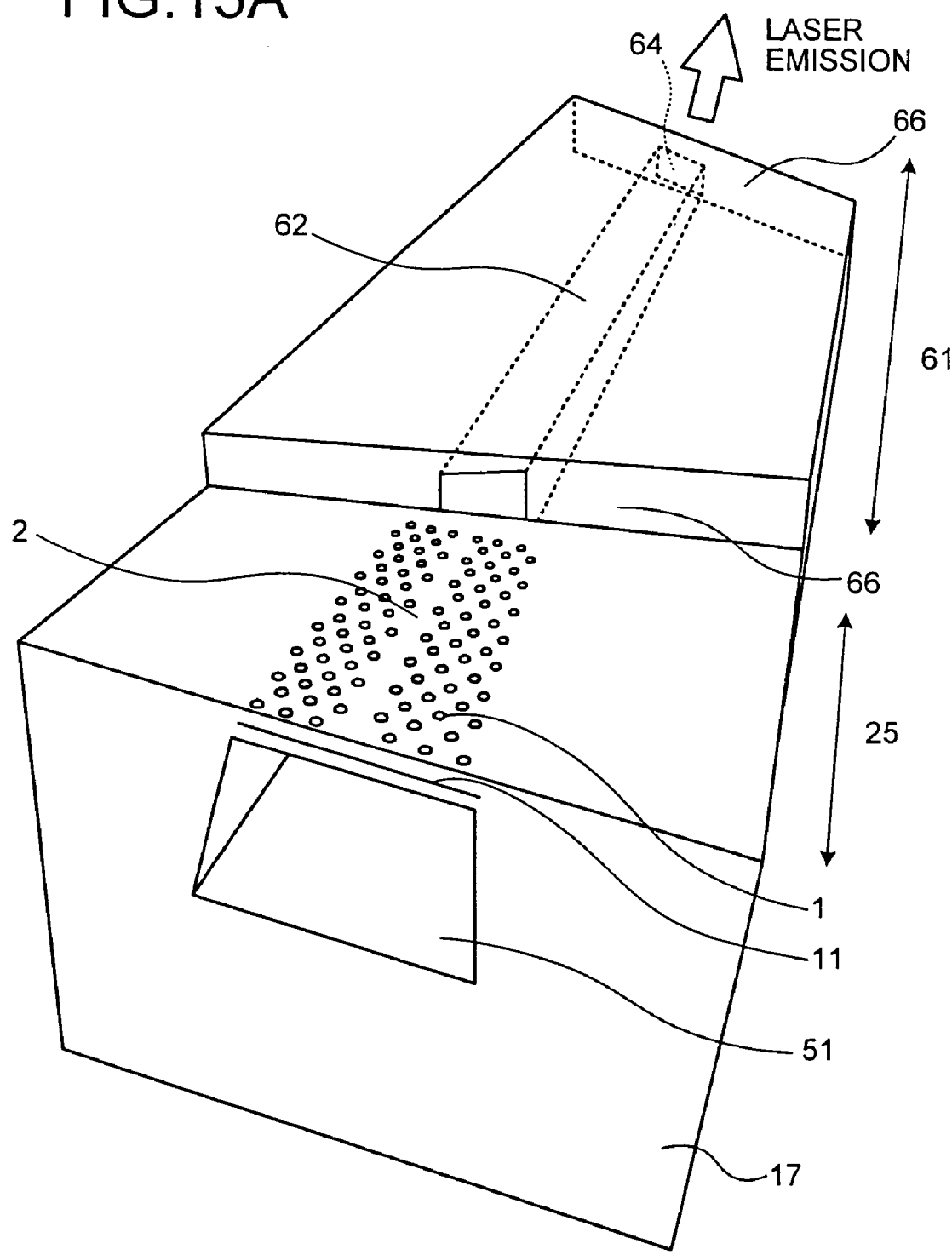
FIG. 15A is a perspective of an example of an optical device according to a tenth embodiment of the present invention.
Figure 15B:
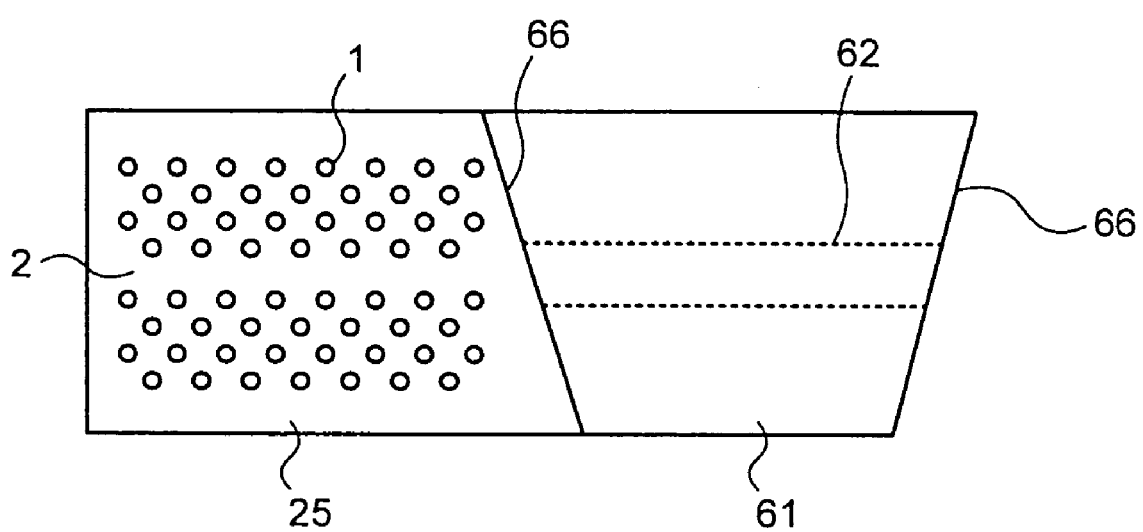
FIG. 15B is a plan view of the optical device shown in FIG. 15A.

FIG. 15A is a perspective of an example of an optical device according to a tenth embodiment of the present invention. FIG. 15B is a plan of the optical device shown in FIG. 15A. The optical device shown in FIGS. 15A and 15B differs from that according to the eighth embodiment shown in FIG. 13 in that each of end portions 66 of the optical amplification section 61 on the thin film slab structure section 25 side and the emission section 64 side forms an angle other than 90 degrees with respect to the extension direction of the waveguide 62. For example, the thin film slab structure section 25-side end portion 66 of the waveguide 62 in the optical amplification section 61 is arranged at the angle other than 90 degrees with respect to the extension direction of the waveguide 62. By doing so, a reflectance of the laser light returned into the waveguide 62 by this end portion 66 is reduced. In addition, the laser light reflected by the emission section 64-side end portion 66 of the optical amplification section 61 is prevented from being incident on the thin film slab structure section 25.

In FIGS. 15A to 15B, each of the end portions 66 of the waveguide 62 in the optical amplification section 61 is arranged at the angle other than 90 degrees with respect to the extension direction of the waveguide 62. However, it suffices that at least one of the thin film slab structure section 25-side end portion and the emission section 64-side end portion is arranged at the angle other than 90 degrees with respect to the extension direction of the waveguide 62. In addition, the window 63 which does not have the waveguide structure or the antireflection coating may be provided in at least one end portion of the waveguide 62 in the optical amplification section 61, the curved structure may be provided in at least one end portion of the waveguide 62 as explained in the eighth and the ninth embodiments, or a combination thereof can be applied to the optical device according to the tenth embodiment.

According to the tenth embodiment, the end portion 66 of the optical amplification section 61 on the side on which the waveguide 62 is formed is arranged at the angle other than 90 degrees with respect to the extension direction of the waveguide 62. Therefore, the reflection of the laser light by the end portion of the waveguide 62 in the optical amplification section 61 can be suppressed, and the optical amplification section 61 can be suppressed from operating as the resonator independently.

According to the eighth to the tenth embodiments, the thin film slab structure section 25 of the optical device is constituted so that the substrate 17 in the lower portion of the two-dimensional slab photonic crystal is removed to thereby provide a hollow portion 51, as shown in FIG. 13 to FIG. 15A. This hollow portion 51 may be buried with a material having a lower refractive index than that of the active layer such as a polymer or a dielectric. Because of the use of the low refractive index material, the thin film slab structure section 25 can oscillate the laser light even if the hollow portion 51 in the thin film slab structure section 25 is buried with the material. In addition, by burying the hollow portion 51 with the low refractive index material, radiation of the thin film slab structure section 25 can be facilitated, as compared with the thin film slab structure 25 including the hollow portion 51 which is not buried. Further, the thin film slab structure section 25 is supported and fixed by the low refractive index material, as compared with the thin film slab structure section including only the slab layer. Therefore, the mechanical strength of the thin film slab structure section 25 can be intensified.

According to the eleventh embodiment, by burying the hollow portion 51 of the thin film slab structure section 25 with the low refractive index material, the mechanical strength of the thin film slab structure section 25 in the optical device can be intensified and temperature characteristics thereof can be improved.

It is difficult to constitute a high-velocity direct modulation laser at a velocity equal to or higher than 20 gigabits per second using the conventional single laser diode. The thin film slab structure section 25 composed of the two-dimensional slab photonic crystal and the like can oscillates a laser light with a very small size. Therefore, the high-velocity direction modulation laser at a velocity equal to or higher than 20 gigabits per second can be constituted using the thin film slab structure section 25.

Figure 16A:
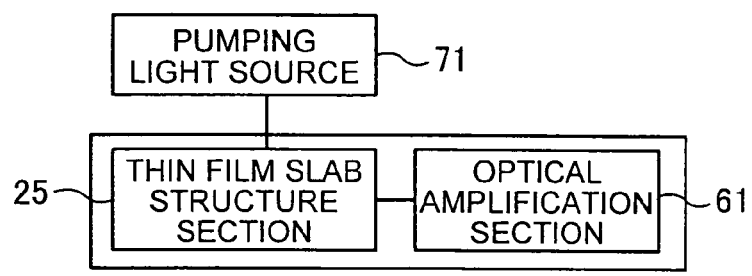
FIG. 16A is a block diagram of an optical device according to a twelfth embodiment of the present invention.
Figure 16B:
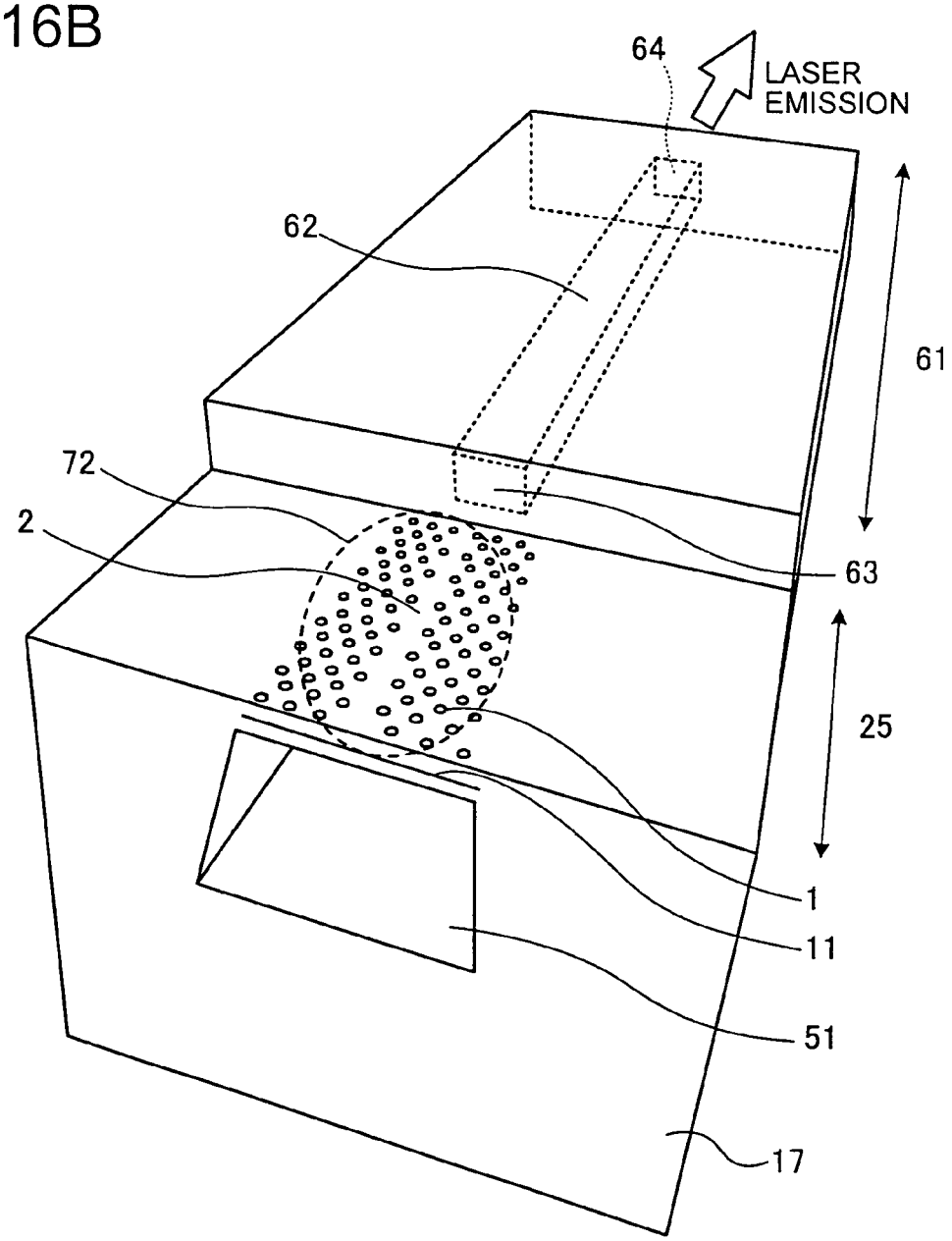
FIG. 16B is a perspective of a part of the optical device including a thin film slab structure section.

FIG. 16A is a block diagram of an optical device according to a twelfth embodiment of the present invention. FIG. 16B is a perspective of a part of the optical device which includes the thin film slab structure section 25. This optical device includes a pumping light source 71, such as a surface-emitting laser, which can be switched on or off by a laser light, and which supplies a pumping light to the thin film slab structure section 25, the thin film slab structure section 25 which generates a laser light from the light emitted from the laser pumping light source 71, and the optical amplification section 61, such as a semiconductor optical amplifier, which amplifies the laser light generated in the thin film slab structure section 25. The pumping light source 71 is a light source used to directly modulate the laser light in the thin film slab structure section 25. Therefore, the pumping light source 71 is provided relative to the thin film slab structure section 25 so that the pumping light can be irradiated-entirely onto a region 72 in which the air hole structure of the thin film slab structure section 25 is formed. As the thin film slab structure section 25 and the optical amplification section 61, those explained in one of the eighth to the eleventh embodiments can be used. In FIG. 16B, the same thin film slab structure section 25 and optical amplification section 61 as those of the optical device according to the eighth embodiment are shown.

The thin film slab structure section 25 in this optical device is pumped by the laser light output from the pumping light source 71. The oscillated laser light is, therefore, modulated by the light output from the pumping light source 71. If a wavelength of the laser light oscillated in the thin film slab structure section 25 is set at 1.3 or 1.5 micrometers, a wavelength of the pumping light source 71 may be set at 0.8 or 0.98 micrometer.

According to the twelfth embodiment, by irradiating the pumping light output from the pumping light source 71 onto the upper surface of the thin film slab structure section 25, the laser light oscillation in the thin film slab structure section 25 can be turned on or off. The optical device can thereby function as a high-velocity direct modulation laser. If the optical device functions as the high-velocity direct modulation laser, the optical device has the following advantages. It is unnecessary to form a pn junction in the two-dimensional slab photonic crystal that constitutes the thin film slab structure section 25. Because of light pumping, leakage of the current between the thin film slab structure section 25 and the optical amplification section 61 does not occur, as compared with current pumping.

Figure 17A:
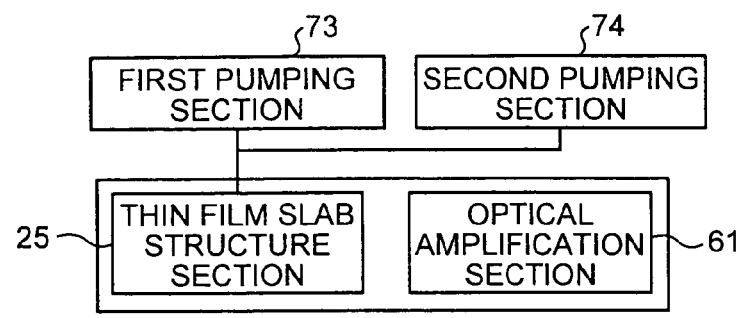
FIG. 17A is a block diagram of an optical device according to a thirteenth embodiment of the present invention.
Figure 17B:
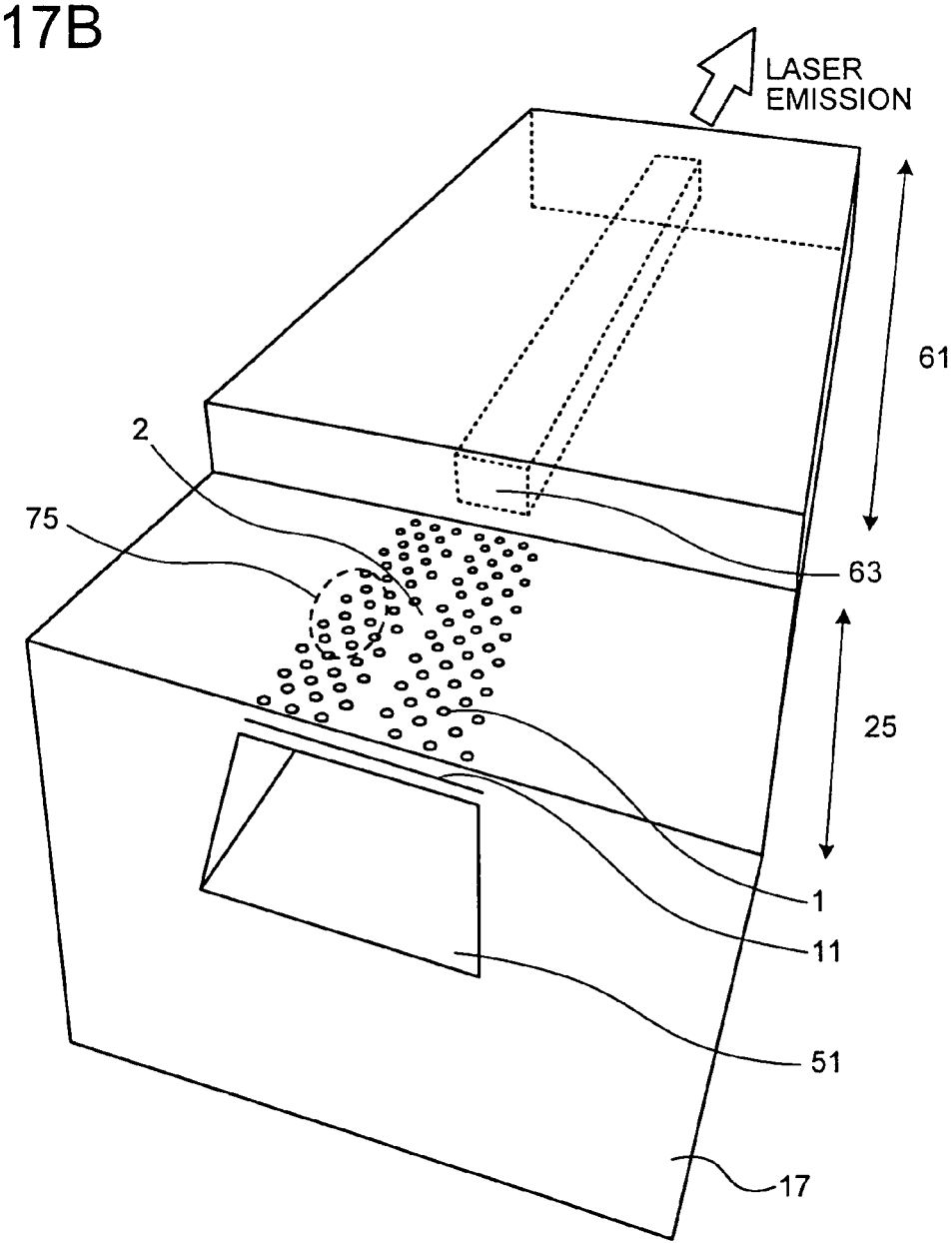
FIG. 17B is a perspective of a part of the optical device including a thin film slab structure section.

FIG. 17A is a block diagram of an optical device according to a thirteenth embodiment of the present invention. FIG. 17B is a perspective of a part of the optical device which includes the thin film slab structure section 25. This optical device includes a first pumping section 73 which pumps the thin film slab structure section 25 to oscillate a laser light, a second pumping section 74 which irradiates a light onto a region 75 in a part of the thin film slab structure section 25 to change a laser light oscillation state, the thin film slab structure section 25 which generates a laser light by being pumped by the first and the second pumping sections 73 and 74, and the optical amplification section 61, such as a semiconductor amplifier, which amplifies the laser light generated in the thin film slab structure section 25. As the thin film slab structure section 25 and the optical amplification section 61, those explained in one of the eighth to the eleventh embodiments can be used. In FIG. 17B, the same thin film slab structure section 25 and optical amplification section 61 as those of the optical device according to the eighth embodiment are shown.

The first pumping section 73 pumps the thin film slab structure section 25, and may perform either current pumping or light pumping. If the first pumping section 73 is to pump the thin film slab structure section 25 by current, the first pumping section 73 includes an electrode arranged so as to pump the active layer of the thin film slab structure section 25, controls a current applied to this electrode, and thereby oscillates the laser light. If the first pumping section 73 is to pump the thin film slab structure section 25 by light, the first pumping section 73 has a pumping light source such as a surface-emitting laser arranged so as to irradiate the light onto the entire upper surface of the thin film slab structure section 25 as explained in the twelfth embodiment, and pumps the active layer to oscillate the laser light.

The second pumping section 74 is a pumping light source which irradiates a light onto the region 75 in a part of the thin film slab structure section 25. As the second pumping light source 74, a surface-emitting semiconductor laser, for example, can be employed. The second pumping section 74 is arranged relative to the thin film slab structure section 25, for example, so as to irradiate a laser light onto the region 75 shown in FIG. 17B. When the thin film slab structure section 25 which has been pumped by the first pumping section 73 is irradiated with the light from the second pumping section 74 and thereby further pumped, the laser light oscillation state of the thin film slab structure section 25 changes. The laser light oscillation can be thereby turned on or off. The region 75 irradiated with the light by the second pumping section 75 shown in FIG. 17B is only one example, and a region other than the region 75 on the upper surface of the thin film slab structure section 25 may be irradiated with light by the second pumping section 74.

According to the thirteenth embodiment, even if a light irradiation intensity of the second pumping section 74 such as the surface-emitting semiconductor laser is low, the laser light oscillation of the thin film slab structure section 25 can be driven to be on or off, as compared with the twelfth embodiment.

According to the eighth to the thirteenth embodiments, the optical devices each constituted so that the thin film slab structure section 25 and the optical amplification section 61 are arranged with their respective waveguides connected in series have been explained. According to a fourteenth embodiment, a method of manufacturing such an optical device will be explained.

As shown in FIG. 13 to FIG. 17B, each of the optical devices according to the eighth to the thirteenth embodiments is constituted so that the thin film slab structure section 25 and the optical amplification section 61 are connected in series. In addition, the thin film slab structure section 25 is constituted as a sheet-like section in which the hollow portion 51 is formed in the lower portion of the slab layer. Further, the thin film slab structure section 25 and the optical amplification section 61 can be formed on the same substrate using the same compound semiconductor material. However, in order to form the hollow portion 51, only the substrate part in the lower portion of the thin film slab structure section 25 needs to be removed without removing the substrate part in the lower portion of the optical amplification section 61. To do so, it is necessary to form the substrate part in which the thin film slab structure section 25 is formed and the substrate part in which the optical amplification section 61 is formed using different materials. Therefore, when the thin film slab structure section 25 is connected to the optical amplification section 61, a substrate having an epitaxial structure in which materials having difference compositions are re-grown in the respective regions on the substrate 17 is employed.

For example, InP has a property of being more easily etched by HCl, and InGaAsP has a property of being less easily etched by HCl. Thus, an InP-based substrate can be employed as the substrate 17 used to manufacture the optical device. In this case, InP or InGaAsP at a wavelength smaller than a composition wavelength of 1.08 micrometers is grown as the lower cladding layer in the region in which the thin film slab structure section 25 is formed (hereinafter, "thin film slab structure section formation region"), and InGaAsP at a wavelength larger than the composition wavelength of 1.08 micrometers is grown as the lower cladding layer in the region in which the optical amplification section 61 is formed (hereinafter, "optical amplification section formation region"). InGaAs at the wavelength smaller than the composition wavelength of 1.08 micrometers is more easily etched by HCl, whereas InGaAsP at the wavelength larger than the composition wavelength of 1.08 micrometers is less easily etched by HCl. When a thin film is formed in one of the two regions, the other region is covered with a mask and the mask is removed after the thin film is formed. By doing so, thin films different in composition can be formed in the different regions on one substrate 17. The material which is more easily etched by a solution such as HCl is used in the thin film slab structure section formation region on the substrate 17 on which the thin films different in composition are thus re-grown. As a result, after the thin films are formed on the substrate 17, the hollow portion 51 can be formed by selectively removing only the thin film slab structure section formation region by wet etching.

Figure 18:
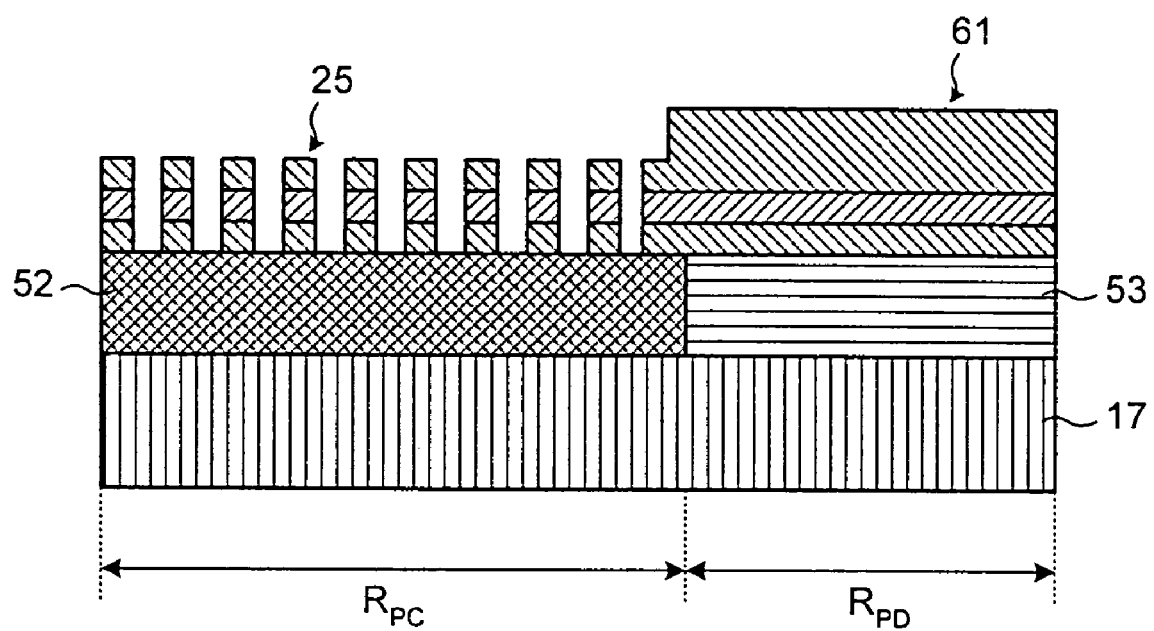
FIG. 18 is a cross-sectional view of an optical device when a lower portion of a thin film slab structure is made of a dielectric having a low refractive index.

For the optical devices shown in FIG. 13 to FIG. 17B, the instances in which the substrate part in the lower portion of the thin film slab structure section 25 is removed and the hollow portion 51 is formed have been explained. Alternatively, the substrate part in the lower portion of the thin film slab structure section 25 may have a dielectric structure having a lower refractive index than that of the active layer 11 in stead of forming the hollow portion 51; FIG. 18 is a cross-sectional view that typically illustrates a structure of an optical device when the lower portion of the thin film slab structure section 25 is made of a dielectric having a low refractive index. The cross-sectional view shown in FIG. 18 is a cross-sectional view of the thin film slab structure section 25 and the optical amplification section 61 in parallel to the extension direction of the waveguides 2 and 62. The optical device shown in FIG. 18 is constituted as follows. A low refractive index dielectric layer 52 is formed in a thin film slab structure section formation region $R_{PC}$ on the substrate 17, and a compound semiconductor layer 53 is formed in an optical amplification section formation region $R_{PD}$ on the substrate 17. In addition, the thin film slab structure section 25 and the optical amplification section 61 are formed on the low refractive index dielectric layer 52 and the compound semiconductor layer 53, respectively.

The optical device having such a structure is manufactured as follows. An Al-containing compound semiconductor material such as AlGaInAs or AlInAs is grown on the substrate 17 as the lower cladding layer in the thin film slab structure section formation region $R_{PC}$. A compound semiconductor material which does not contain Al is grown on the substrate 17 as the lower cladding layer in the optical amplification section formation region $R_{PD}$. Alternatively, a compound semiconductor material that includes a region which contains Al and a region which does not contain Al is put on the substrate 17. The Al containing compound semiconductor material and the compound semiconductor material which does not contain Al, or the compound semiconductor material that includes the region which contains Al and the region which does not contain Al is molten and bonded onto the substrate 17 while pressure is applied and temperature is increased. Thereafter, when this substrate 17 is subjected to a heat treatment in an oxygen containing atmosphere, Al in the Al-containing compound semiconductor material in the thin film slab structure section formation region $R_{PC}$ is oxidized by thermal oxidization and transformed to a low refractive index dielectric, thereby forming a dielectric layer 52. At this moment, the compound semiconductor material in the other regions has no change. Namely, only the substrate part in the thin film slab structure section formation region $R_{PC}$ can be selectively formed as the low refractive index dielectric. By collectively forming the thin film slab structure section 25 and the optical amplification section 61 on the substrate 17 having different compositions, the optical device explained in each of the eighth to the thirteenth embodiments can be manufactured. The thermal oxidation of the Al-containing compound semiconductor material formed in the thin film slab structure section formation region $R_{PC}$ on the substrate 17 may be performed after forming the optical device is entirely formed.

Figure 19A:
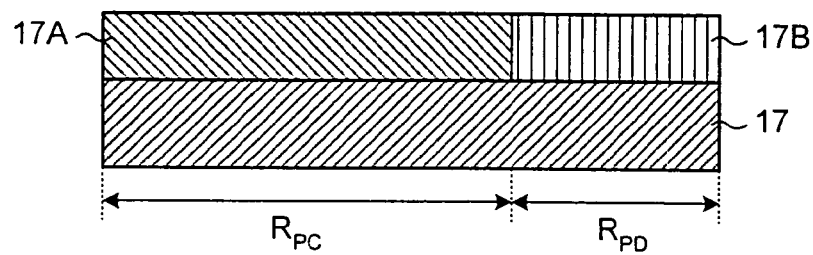
FIG. 19A to 19E are cross-sectional views that typically illustrate a method of collectively forming a thin film slab structure section and an optical amplification section.
Figure 19B:
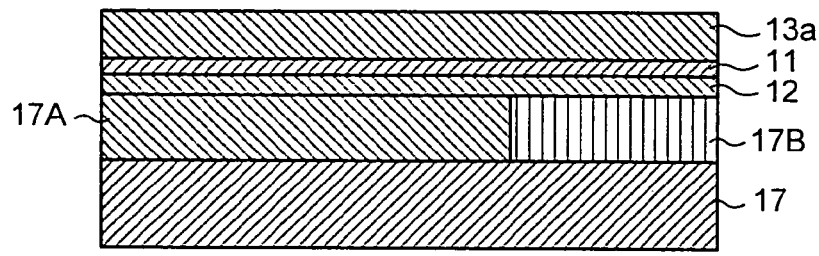
Figure 19C:
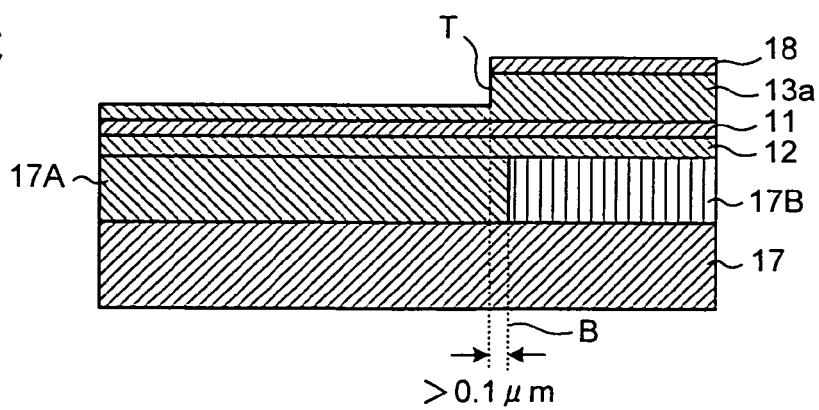
Figure 19D:
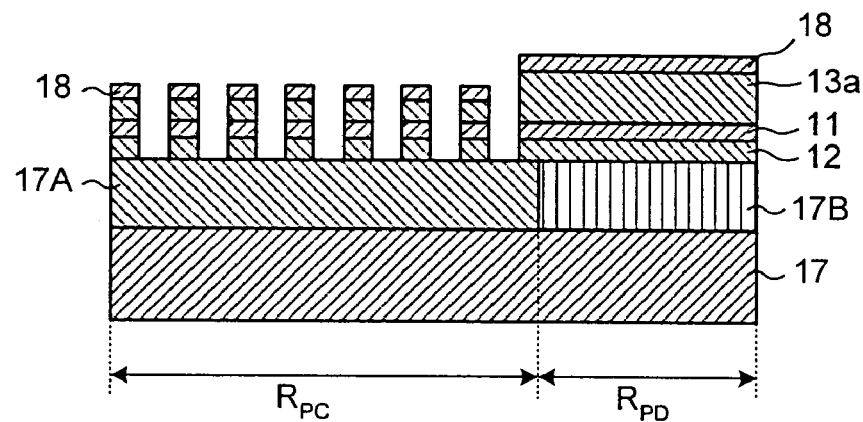
Figure 19E:
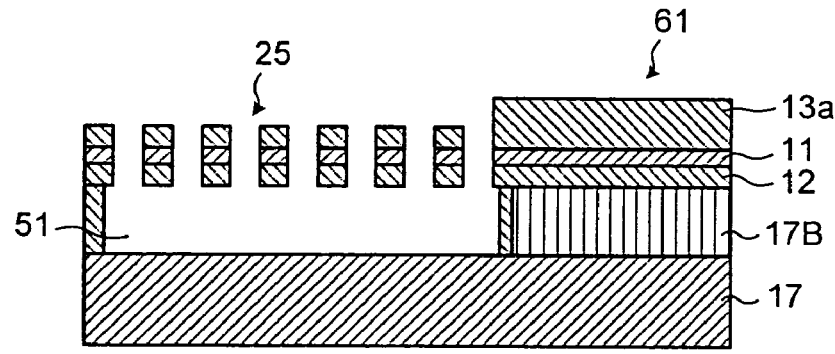

FIG. 19A to FIG. 19E are cross-sectional views that typically illustrate a method of collectively forming the thin film slab structure section and the optical amplification section. Compound semiconductor materials 17A and 17B different in composition are re-grown in the thin film slab structure section formation region $R_{PC}$ and the optical amplification section formation region $R_{PD}$ on the substrate 17, respectively. The lower cladding layer 12, the active layer 11, and an upper cladding layer 13 that includes a material serving as the upper cladding layer of the slab layer 14 formed in the thin film slab structure section formation region $R_{PC}$, an etching stop layer, a material serving as the upper cladding layer formed in the optical amplification section formation region $R_{PD}$ are formed on the entire surface of the substrate 17 in this order, thereby forming the waveguide 62 in the optical amplification section 61 (FIG. 19B). A mask is formed on the optical amplification section formation region $R_{PD}$, and the upper cladding layer 13a is removed by dry etching so that the slab layer 14 in the thin film slab structure section formation region $R_{PC}$ has a submicron-order thickness (FIG. 19C). Not only the dry etching but also wet etching may be performed so as to remove the upper cladding layer 13a more accurately. By removing the upper cladding layer 13a by both dry etching and wet etching, a boundary with the upper layer of the thin film slab structure section 25 can be accurately controlled as compared with the removal of the upper cladding layer 13 only by the dry etching. In addition, a boundary for removing the upper cladding layer 13a, that is, a thin film slab structure section 25-side end portion T of the optical amplification section 61 is located on the thin film slab structure section formation region $R_{PC}$-side at a distance of 0.1 micrometer, preferably 0.2 micrometer or more from a re-growth interface B between the thin film slab structure section formation region $R_{PC}$ and the optical amplification section formation region $R_{PD}$ formed on the substrate 17. By so forming, the compound semiconductor material or substrate material 17A in the lower portion of the thin film slab structure section 25 can be removed by wet etching without adversely influencing the re-growth interface B at a later step of forming the hollow portion 51. As explained in the first embodiment, the mask 18 of the exposure resist or the like applied on a region, in which the periodic air hole structure is not formed, of the thin film slab structure section formation region $R_{PC}$ and the optical amplification section 61, and the air holes 1 are formed (FIG. 19D). The mask 18 is then removed, and the substrate 17 is immersed in an etchant such as HCl to etch the substrate material 17A in the lower portion of the slab layer 14 (FIG. 19E). As a result, the optical device in which the thin film slab structure section 25 and the optical amplification section 61 are collectively formed is manufactured.

If the hollow portion 51 in the lower portion of the thin film slab structure section 25 is to be buried with a polymer, a step of injecting the polymer from a sidewall of the substrate 17 in which the hollow portion 51 is formed or from the air holes 1 shown in a front part of the thin film slab structure section 25 shown in FIG. 13 or 14, and of solidifying the injected polymer is executed. If the low refractive index dielectric layer is to be formed in the lower portion of the thin film slab structure section 25, a step of thermally oxidizing the compound semiconductor material 17A is executed instead of performing wet etching for forming the hollow portion 51. If the waveguide 62 in the optical amplification section 61 is to be formed as an embedded waveguide, a step of depositing the upper surface of the optical amplification section 61 with the same material as that for the upper cladding layer 13, the substrate 17, or the like is executed.

According to the fourteenth embodiment, the compound semiconductor materials different in composition are re-grown in the thin film slab structure section formation region $R_{PC}$ and the optical amplification section formation region $R_{PD}$ on the single substrate 17, respectively. Therefore, after forming the thin film slab structure section 25, only the material for the lower portion of the thin film slab structure section 25 can be removed by wet etching, or thermally oxidized to thereby reduce the refractive index of the lower portion. If the thin film slab structure section formation region $R_{PC}$ is formed by InP or InGaAsP at the wavelength smaller than the composition wavelength of 1.08 micrometer and the optical amplification section formation region $R_{PD}$ is formed by InGsAsP at the wavelength larger than the composition wavelength of 1.08 micrometer on the substrate 17, in particular, only the material for the thin film slab structure section formation region $R_{PC}$ can be removed by wet etching using HCl, thereby facilitating forming the slab structure. Further, if the thin film slab structure section formation region $R_{PC}$ is formed by the Al-containing compound semiconductor material and the optical amplification section formation region $R_{PD}$ is formed by the compound semiconductor which does not contain Al on the substrate 17, only the material for the thin film slab structure section formation region $R_{PC}$ can be thermally oxidized and transformed into the low refractive index material, thereby facilitating forming the slab structure.

Moreover, by epitaxially growing the upper layer including the active layer 11 using the material common to the thin film slab structure section 25 and the optical amplification section 61, an optical device manufacturing cost can be reduced. When the entire surface of the thin film slab structure section 25 and parts of the upper cladding layer 13 other than the Waveguide 62 part of the optical amplification section 61 are removed by wet etching, the mask is applied only on the non-removed parts. It is thereby possible to remove the thin film slab structure section 25-side end portion of the optical amplification section 61 more accurately than the removal by dry etching. Besides, by causing the thin film slab structure section 25-side end portion T of the optical amplification section 61 to be located on the thin film slab structure section 25 side, relative to the re-growth interface B on the substrate 17, the slab structure can be formed by removing the material for the lower portion of the thin film slab structure section 25 by wet etching without adversely influencing the re-growth interface B.

According to the ninth to the fourteenth embodiments, the optical amplification section 61 has the buried waveguide structure. Alternatively, the optical amplification section 61 may have the ridge waveguide structure.

According to the present invention, a structure of the optical device can be simplified and the optical device can be manufactured with simpler method.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An optical device including a slab layer comprising, laminated, an active layer and cladding layers, spreading two-dimensionally, having a periodic refractive index profile structure in a two-dimensional plane, and a two-dimensional slab photonic crystal structure including a linear defect region serving as a waveguide in the periodic refractive index profile structure, wherein the waveguide includes a plurality of regions having different widths, and the plurality of regions having different widths are arranged in series.

2. The optical device according to claim 1, wherein the plurality of regions arranged in series extends in a direction in which the waveguide extends and the widths of the plurality of regions arranged in series decrease sequentially along the direction.

3. The optical device according to claim 1, wherein the plurality of regions arranged in series extends in a direction in which the waveguide extends and each of the regions of the plurality of regions has a respective, different length along the direction in which the waveguide extends.

4. The optical device according to claim 1, wherein the plurality of regions extends in a direction in which the waveguide extends and further including electrodes for controlling respective regions of the plurality of regions and located substantially parallel to the direction in which the waveguide extends, wherein at least one of the electrodes is divided in one of the regions of the plurality of regions.

5. The optical device according to claim 4, further comprising a control unit that controls magnitudes of currents applied to the electrodes in each of the regions of the plurality of regions.

6. A semiconductor laser oscillator comprising:
an optical device including a slab layer comprising, laminated, an active layer and cladding layers, spreading two-dimensionally, having a periodic refractive index profile structure in a two-dimensional plane, and a two-dimensional slab photonic crystal structure including a linear defect region serving as a waveguide in the periodic refractive index profile structure, wherein
the waveguide includes a plurality of regions, each of the regions having a respective, different width, the regions are arranged in series so that the widths of the regions decrease sequentially along the waveguide from a first end to a second end that is narrower than the first end, and the semiconductor laser oscillator simultaneously actuates all of the regions of the optical device, collects laser light from all of the regions, and emits laser light from the first end of the plurality of regions that are arranged in series.

7. The semiconductor laser oscillator according to claim 6, further comprising a temperature adjustment unit that adjusts temperature of the optical device to a fixed temperature.

8. A semiconductor laser oscillator comprising:

an optical device including a slab layer comprising, laminated, an active layer and cladding layers, spreading two-dimensionally, having a periodic refractive index profile structure in a two-dimensional plane, and a two-dimensional slab photonic crystal structure including a linear defect region serving as a waveguide in the periodic refractive index profile structure, wherein the waveguide includes a plurality of regions having different widths, arranged so that segments of the waveguide are connected in series, and the semiconductor laser oscillator actuates one of the regions of the optical device and collects laser light from the region actuated at an end of the segments of the waveguide connected in series.

9. The semiconductor laser oscillator according to claim 8, further comprising a temperature adjustment unit that adjusts temperature of the optical device to a fixed temperature.

* * * * *